United States Patent [19]

Fukui et al.

[11] Patent Number: 5,677,249
[45] Date of Patent: Oct. 14, 1997

[54] SEMICONDUCTOR APPARATUS AND PRODUCTION METHOD FOR THE SAME

[75] Inventors: Masahiro Fukui, Osaka; Mizuki Segawa, Kyoto; Toshiro Akino; Michikazu Matsumoto, both of Osaka, all of Japan

[73] Assignee: Matsushita Electric Industrial Co., Ltd., Osaka, Japan

[21] Appl. No.: 670,927

[22] Filed: Jun. 26, 1996

Related U.S. Application Data

[62] Division of Ser. No. 611,408, Mar. 6, 1996.

[30] Foreign Application Priority Data

Mar. 8, 1995 [JP] Japan ................... 7-048063

[51] Int. Cl.⁶ .................................. H01L 21/265
[52] U.S. Cl. ................. 437/41 SW; 437/40 SW; 437/195
[58] Field of Search ............... 437/40 SW, 41 SW, 437/195, 984, 228; 148/DIG. 19–20

[56] References Cited

U.S. PATENT DOCUMENTS

| | | | |
|---|---|---|---|
| 4,619,038 | 10/1986 | Pintchovski | 29/590 |
| 5,366,930 | 11/1994 | Kim | 437/195 |
| 5,393,688 | 2/1995 | Motonami et al. | 437/52 |

*Primary Examiner*—John Niebling
*Assistant Examiner*—Joni Y. Chang
*Attorney, Agent, or Firm*—McDermott, Will & Emery

[57] ABSTRACT

A gate wire is formed so as to extend from an active area to a separation, and an impurity diffused area is formed on each side of the gate electrode located on the active area. A contact member for connecting the gate wire to a first layer aluminum interconnection formed in an upper layer of the gate wire is in contact with the gate wire at a portion located on the active area. The utilization ratio of the active area is thus improved, and hence, the width of the separation can be minimized. In addition, by eliminating a mask alignment margin from the gate wire and suppressing the width of the gate wire not to exceed the width of the contact member, the occupied area of a semiconductor apparatus can be reduced.

6 Claims, 18 Drawing Sheets

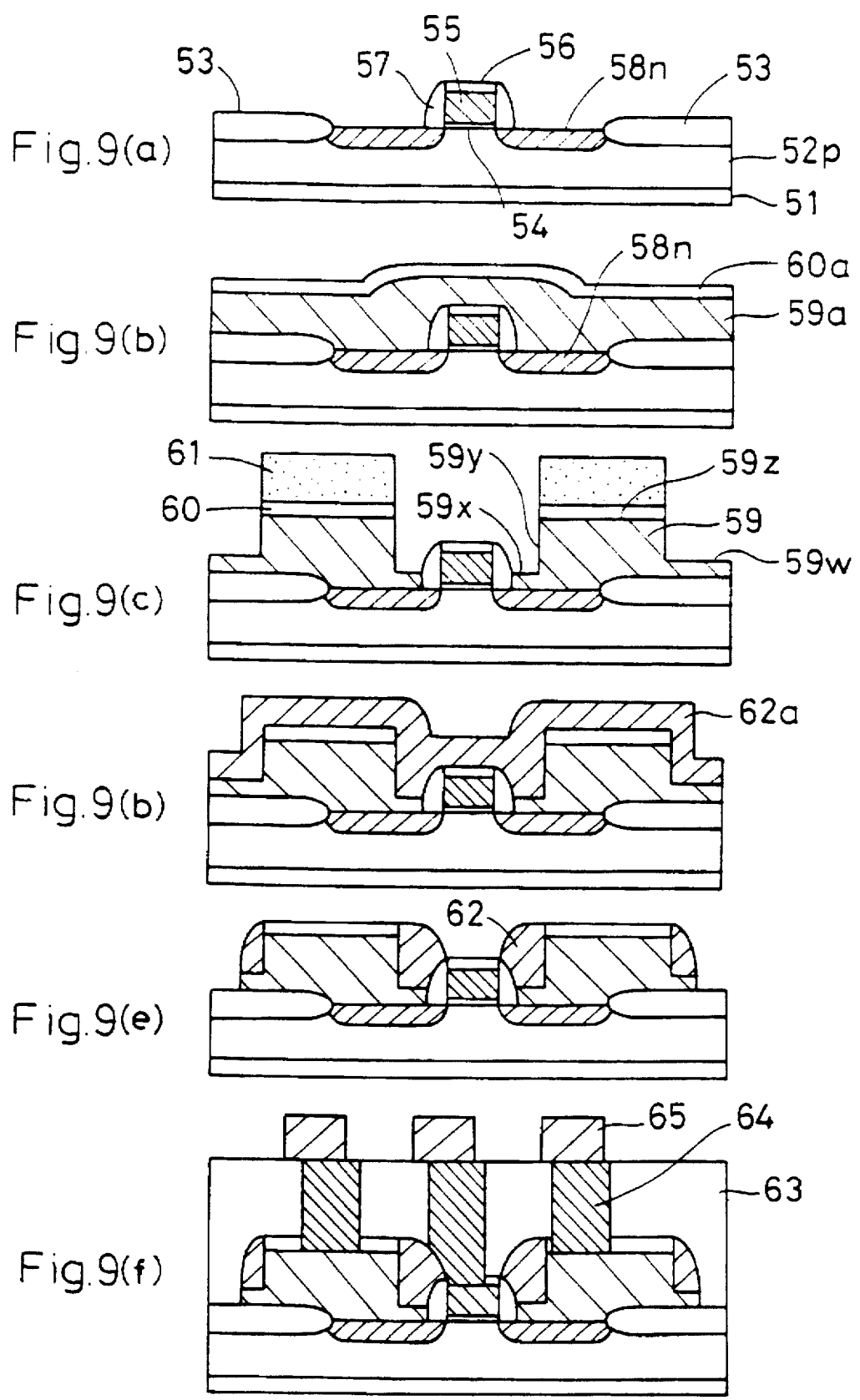

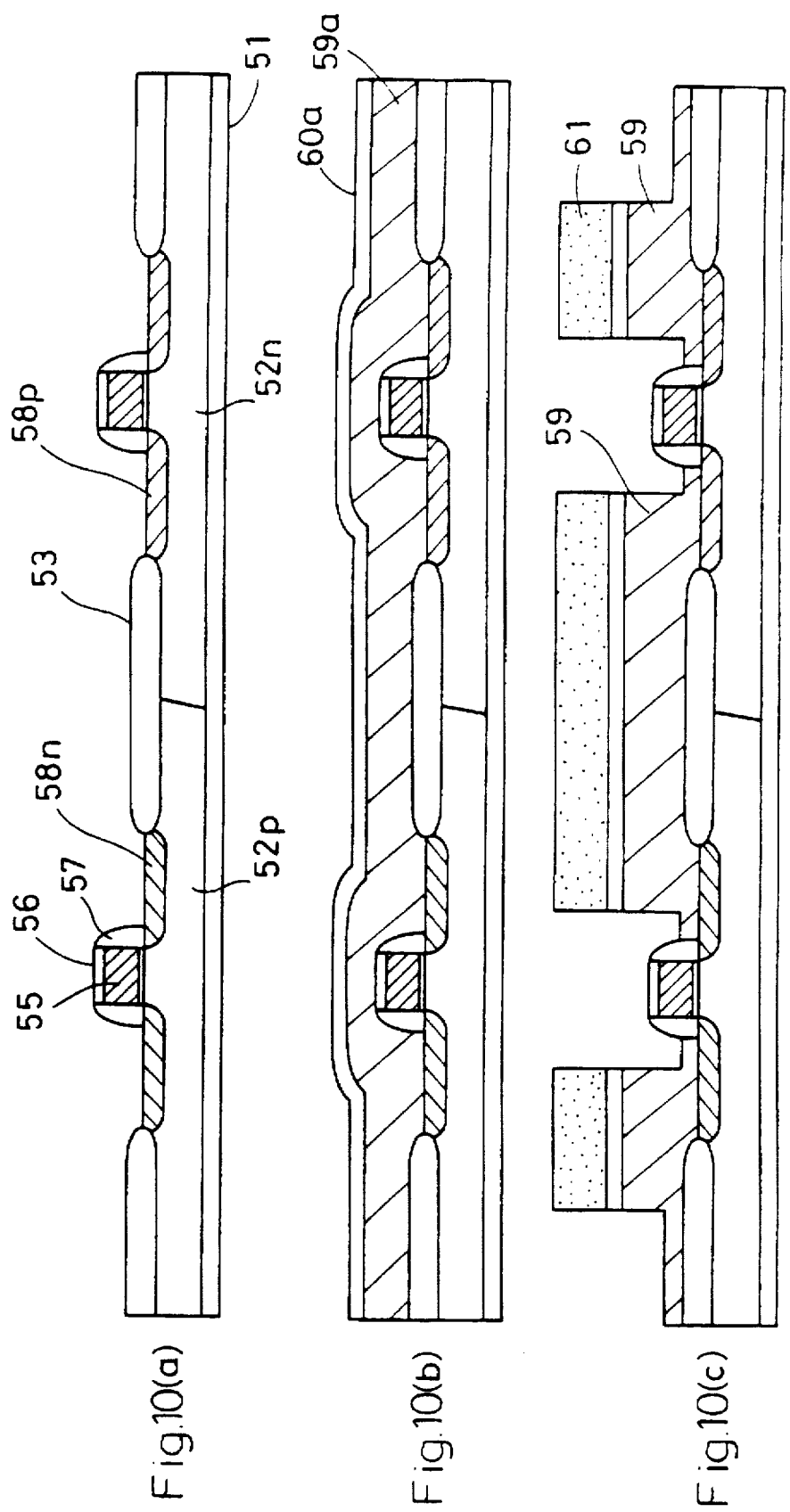

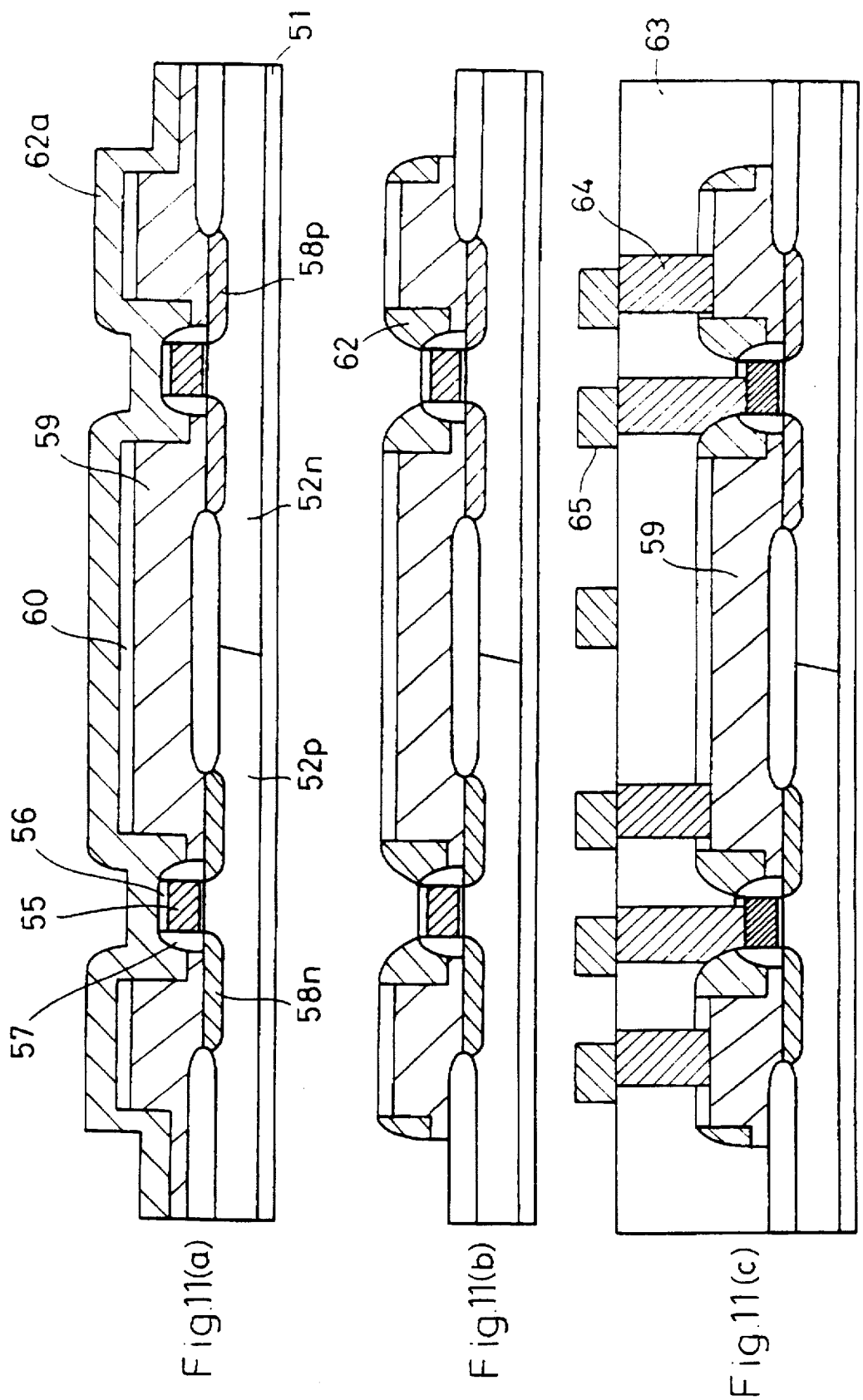

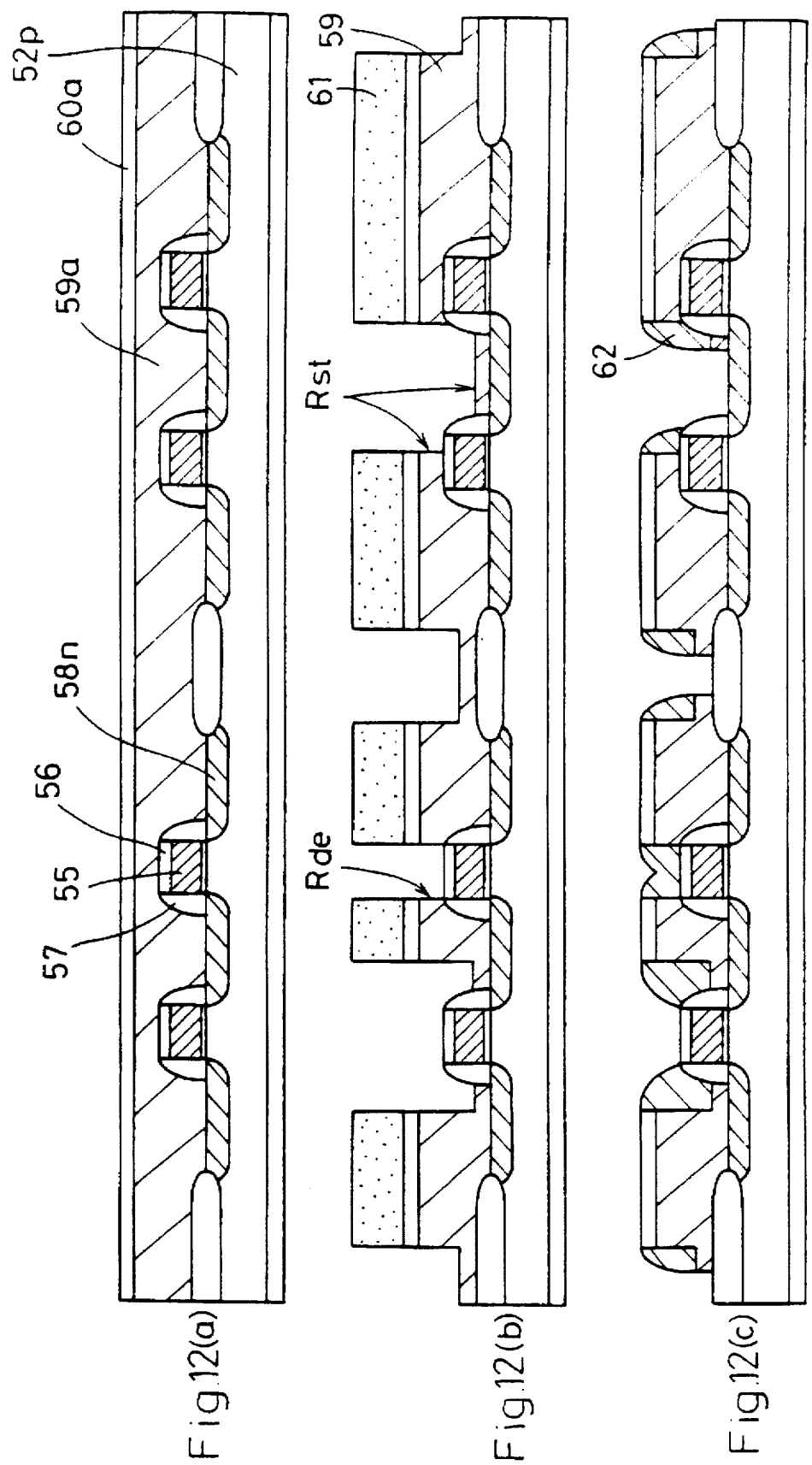

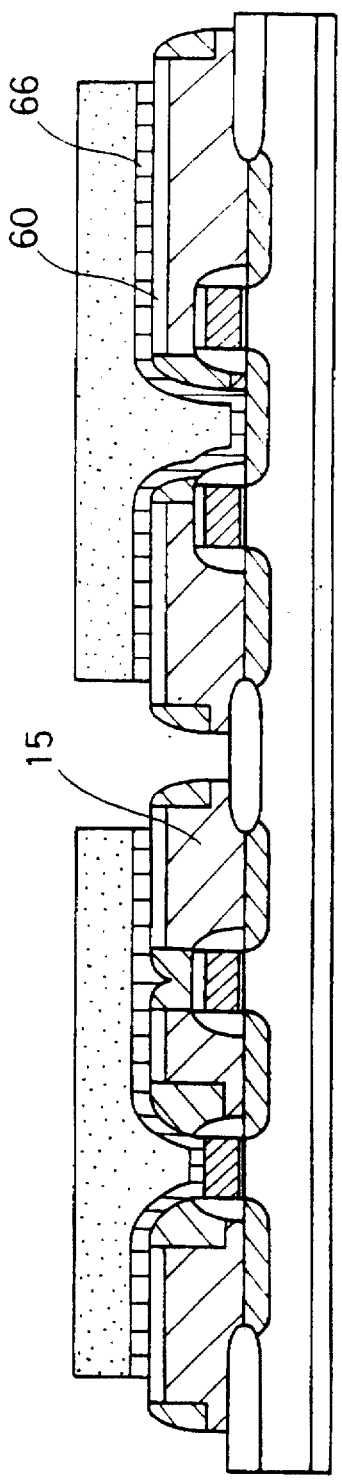
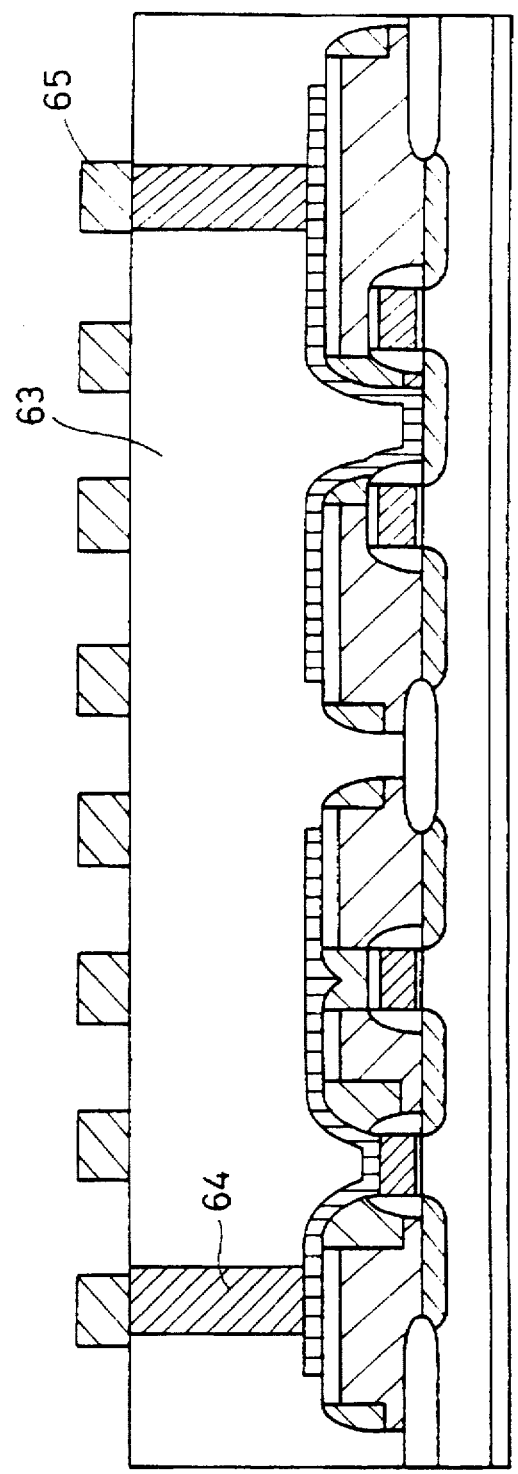
Fig.13(a)
Fig.13(b)

SEMICONDUCTOR APPARATUS AND PRODUCTION METHOD FOR THE SAME

This is a divisional of application Ser. No. 08/611,408, filed Mar. 6, 1996.

BACKGROUND OF THE INVENTION

The present invention relates to a semiconductor apparatus comprising integration of semiconductor devices and a production method for the semiconductor apparatus. More particularly, the present invention relates to high integration, improved reliability and area decrease of a semiconductor device.

In the production procedure for a conventional semiconductor apparatus including a standard cell, a gate array, a custom cell and the like, the components of the standard cell such as a gate and an impurity defused area of a transistor are first formed, and an interlayer insulating film is deposited thereon. Then, interconnecting members such as aluminum interconnections are formed on the interlayer insulating film. In such a production procedure, when a contact member for connecting the interconnecting member and the gate therebelow is to be formed, a gate wire serving as the gate of the transistor is drawn out of the active area of the transistor, i.e., onto a separation, and then a contact member is formed for electrically connecting the gate wire on the separation and the interconnecting member in an upper layer. A desired logic circuit is thus produced.

FIGS. 16a and 16b illustrate the conventional method for producing a logic circuit of FIG. 1, that is, a logic circuit including three P-channel transistors 1a through 1c serving as path transistors and three N-channel transistors 2a through 2c also serving as path transistors. FIGS. 16a and 16b are schematic plane views of the configuration of the logic circuit after the formation of first layer aluminum interconnections and second layer aluminum interconnections, respectively.

In manufacturing the logic circuit as shown in FIG. 1, an N well 15 is first formed on a P-type semiconductor substrate as is shown in FIG. 16a. Then, a separation made of a LOCOS film is formed so as to surround an active area to be used as a P-type diffused layer 14p within the N well 15 and surround an active area to be used as an N-type diffused layer 14n on the P-type semiconductor substrate where the N well 15 is not formed. In the respective active areas are formed gate wires 11pa through 11pc and 11na through 11nc each made of a polysilicon film aligned in the same direction (in the horizontal direction in FIG. 16a). Each pair of the gate wires is connected to each other via a pad Pd on the separation. Impurity is injected into the active areas by using the gate wires as masks, thereby forming the P-type diffused layer 14p and the N-type diffused layer 14n. After this, first layer aluminum interconnections 13 are formed over the gate wires 11pa through 11pc and 11na through 11nc with a first interlayer insulating film (not shown) sandwiched therebetween. Simultaneously with the formation of the first layer aluminum interconnections 18, a CW contact 12 is formed out of the same aluminum material for connecting each of the first layer aluminum interconnections 13 to the pad Pd of the gate wire on the separation and other elements such as an area serving as the source/drain of each transistor in the diffused layers 14p and 14n. The CW contact 12 can be formed by depositing the same aluminum material as that used for the first layer aluminum interconnections 13 within a contact hole or by burying a metal having a high melting point such tungsten in a contact hole.

Then, as is shown in FIG. 18b, four second layer aluminum interconnections 17a through 17c and 17y are formed on the first layer aluminum interconnections 13 with a second interlayer insulating film (not shown) sandwiched therebetween. Also, CX contacts 16 are formed so as to contact the second layer aluminum interconnections 17 to the first layer aluminum interconnections 13.

Also in an SRAM circuit shown in FIG. 15, a pad Pd is provided on a separation excluding an impurity diffused area 14 of a gate 11, and the pad Pd is connected to a CW contact 12.

FIG. 17 is a schematic plane view of the configuration after the formation of the first layer aluminum interconnections, obtained by replacing a single gate structure of FIG. 16a with a dual gate structure. In a dual gate structure, polysilicon used for the gate wires 12na through 12nc of the N-channel transistors 2a through 2c includes different impurity from that included in polysilicon used for the gate wires 11pa through 11pc of the P-channel transistors 1a through 1c. Owing to the difference in the diffused materials, the gate wires of the N-channel transistors and the P-channel transistors cannot be directly connected to each other. Accordingly, as is shown in FIG. 17, the gate wires are connected to each other via the CW contacts 12 and the first layer aluminum interconnections 13.

In a cell designed by the aforementioned conventional method, the contacts occupy approximately 20 to 30% of the entire area of the cell. In addition, the areas for the contacts are collected around a transistor. In the configuration adopting a dual gate structure as shown in FIG. 17, the area occupied by the contacts is particularly large.

In interconnecting gates and diffused layers, many interconnections generally extend in the vertical direction to the direction of the gates. Therefore, wires drawn from the contacts are collected around a transistor, whereas the areas on the gates are not efficiently used as interconnecting areas.

FIG. 18 is a vertical sectional view of a semiconductor apparatus mounting a conventional MISFET. As is shown in FIG. 18, an N-channel transistor is formed in a P-type diffused layer 52p formed on a P-type semiconductor substrate 51. In this case, a gate electrode 55 is formed on a gate oxide film 54 within an active area surrounded by a separation 53, and a side wall 57 and a gate insulating film 56 are formed on the side and top surfaces of the gate electrode respectively. On each side of the gate electrode 55 is formed an N-type high concentration diffused layer 58n serving as the source/drain. An interlayer insulating film 63 is deposited on the entire surface of the resultant substrate, and the interlayer insulating film 63 is provided with contact holes respectively reaching the gate electrode 55 and the N-type high concentration diffused layer 58n. Then, contact members 64 are formed by depositing a conductive material in the contact holes, and interconnecting members 65 are provided on the interlayer insulating film 68. The interconnecting members 65 are electrically connected to the gate electrode 55 and the N-type high concentration diffused layer 58n.

Recently, a semiconductor device is desired to be further refined because of highly integrated LSIs. For this purpose, it is necessary to achieve (1) refinement of manufacturing rules and (2) minimization of an alignment margin in a photolithographic process.

As a first problem, with regard to the refinement of manufacturing rules, a semiconductor device is expected to be further refined in the future due to the development of element technology. In contrast, the alignment margin is less refined as compared with the dimension of a device. This is one factor against high integration. Particularly in the case where a gate electrode is drawn onto a separation insulating film to form a contact with the gate, although the width of the separation is minimized through the refinement, the minimum rule for the width of the separation depends upon a margin around the contact with the gate. Therefore, even in using a technique that can minimize the separation width by adopting a trench type separation, there arises a problem that the margin around the contact prevents the high integration of an LSI.

As a second problem, in the case where a contact hole is formed on the gate electrode 55 within the active area without taking the margin into consideration as is shown in FIG. 18, excessive over-etching can result in the bottom of the contact hole reaching the N-type high concentration diffused layer 58n in a portion away from the gate electrode 55. This can cause an electric short-circuit between the gate electrode 55 and the N-type high concentration diffused layer 58n via the contact member 64.

SUMMARY OF THE INVENTION

A first object of the invention is minimizing the width of a separation in a semiconductor apparatus by providing means for improving a utilization ratio of an active area, so as to minimize the size of the semiconductor apparatus.

A second object of the invention is minimizing the size of a semiconductor apparatus and improving the reliability thereof by forming a member which has a function to prevent a short-circuit between a gate electrode and an extension electrode extended from an impurity diffused area serving as a source/drain and has a structure that can be formed in a self-alignment manner.

A third object of the invention is providing a semiconductor apparatus in a master slice state which can minimize the size of the completed semiconductor apparatus.

In order to accomplish the first object, a first semiconductor apparatus of this invention comprises a semiconductor substrate; a separation formed on part of the semiconductor substrate; an active area formed in an area surrounded by the separation on the semiconductor substrate; a first conductive member stretching over the active area and the separation and serving as a gate electrode on the active area: an interlayer insulating film deposited on the active area, the separation and the first conductive member; a contact hole formed through the interlayer insulating film so as to reach a top surface of the first conductive member located on the active area: a contact member made of a conductive material buried in the contact hole and electrically connected to the first conductive member: and a second conductive member formed on the contact member and the interlayer insulating film and electrically connected to the contact member.

Owing to this configuration, on the top surface of the first conductive member located on the active area is formed a contact to the second conductive member in the upper layer via the contact member. Therefore, the utilization ratio of the active area is improved, and a space for a contact required for the first conductive member located on the separation is decreased. This decreases the area of the separation and also can minimize the size of the semiconductor apparatus.

In the first semiconductor apparatus, a dimension along a gate length of a portion of the first conductive member in contact with the contact member can be a dimension without a mask alignment margin.

Owing to this configuration, no mask alignment margin for a contact is provided to the first conductive member. Therefore, there is no need to use a conventionally used pad, and hence the interval between the first conductive members can be decreased. In addition, the first conductive members can take a regular shape. Accordingly, The size of the semiconductor apparatus can be minimized.

In the first semiconductor apparatus, a dimension of the contact hole along the gate length can be larger than a dimension of the first conductive member along the gate length.

Owing to this configuration, the dimension along the gate length of the first conductive member can be further decreased, and hence, the active area can be decreased. Therefore, the size of the semiconductor apparatus can be further minimized. Additionally, even when mask alignment is shifted during the formation of a contact hole, the first conductive material can be connected to the contact member without fail.

In the first semiconductor apparatus, the first conductive member is plural in number and arranged parallel to one another: and the second conductive member is plural in number and arranged perpendicular to the first conductive members in a plane view.

Preferably, each of the second conductive materials has substantially the same length.

Owing to this configuration, since the first and second conductive members can take a regular shape, the patterning accuracy in the photolithography can be improved. Therefore, it is possible to decrease the interval between the conductive members, resulting in further minimization of the size of the semiconductor apparatus.

It is possible to further provide a third conductive member formed above the second conductive members with an interlayer insulating film sandwiched therebetween and serving as an interconnection.

This configuration can enrich means for electrical connection between the first conductive members and the active area, and hence, the freedom in the design of the semiconductor apparatus is enlarged.

It is possible to further provide a local interconnection formed above the first conductive members and below the second conductive members for connecting the active area, the gate electrode and the like.

This configuration decreases the number of interconnections in the upper layer because the local interconnection is used for the connection between the components of the device. In addition, there is no need to form a contact hole through the interlayer insulating film reaching the impurity diffused area or the like. Therefore, the mask alignment margin of each component can be decreased, and the size of the semiconductor apparatus can be minimized.

Alternatively, a second semiconductor apparatus of this invention comprises a semiconductor substrate; a separation formed on part of the semiconductor substrate; an active area formed in an area surrounded by the separation on the semiconductor substrate; a first conductive member stretching over the active area and the separation and serving as a gate electrode on the active area; an interlayer insulating film deposited on the active area, the separation and the first conductive member; a contact hole formed through the interlayer insulating film so as to reach a top surface of the first conductive member located on the separation and having a dimension along a gate length larger than a dimension of the first conductive member along the gate length; a contact member buried in the contact hole and electrically connected to the first conductive member: and a second conductive member formed on the contact member and the interlayer insulating film and connected to the contact member.

Owing to this configuration, even when mask alignment shifted during the formation of a contact hole, the first conductive material can be connected to the contact member on the separation without fail. Therefore, since there is no need to provide a mask alignment margin to the first conductive member, the area of the separation can be decreased.

In order to accomplish the second object, a third semiconductor apparatus of this invention comprises a semiconductor substrate; a separation formed on part of the semiconductor substrate; an active area formed in an area surrounded by the separation on the semiconductor substrate; a gate electrode formed on the active area; impurity diffused areas formed on both sides of the gate electrode by introducing an impurity; a first insulating film made of an insulating material and formed on side surfaces of the gate electrode; an extension electrode formed adjacent to the first insulating film so as to cover the impurity diffused area, the extension electrode including a thin film portion in contact with the first insulating film and a thick film portion which is thicker than the thin film portion and is formed with a level difference therebetween; and a second insulating film formed so as to stretch over the level difference of the extension electrode and the first insulating film.

The third semiconductor apparatus can further comprise an interlayer insulating film deposited above the gate electrode, the extension electrode and the first and second insulating films; a contact hole formed through the interlayer insulating film so as to reach at least a top surface of the gate electrode; a contact member made of a conductive material buried in the contact hole and electrically connected to the gate electrode; and an interconnecting member formed on the contact member and the interlayer insulating film and electrically connected to the contact member.

Owing to this configuration, since part of the extension electrode is always in contact with the impurity diffused area, the area of the contact to the interconnecting member in the upper layer can be enlarged. On a portion of the extension electrode close to the gate electrode is formed the second insulating film, and hence, the extension electrode is definitely insulated from the gate electrode. In addition, the second insulating film can be formed in a self-alignment manner, and therefore, the size of the semiconductor apparatus can be decreased and the reliability thereof can be improved.

Preferably, the second insulating film is made of a material having high etching selectivity against the interlayer insulating film.

Preferably, the first insulating film and the interlayer insulating film are made of a silicon oxide film, and the second insulating film is made of a silicon nitride film.

Owing to this configuration, the function of the second insulating film as an etching stopper is highly enhanced in the formation of the contact hole in the interlayer insulating film. Therefore, it is possible to prevent a short-circuit between the gate electrode and the extension electrode via the contact member between the gate electrode and the first conductive member.

The third semiconductor apparatus can further comprise an interlayer insulating film deposited above the gate electrode, the extension electrode and the first and second insulating films; a contact hole formed through the interlayer insulating film so as to reach a top surface of the extension electrode located on the separation; a contact member made of a conductive material buried in the contact hole and electrically connected to the extension electrode; and a second interconnecting member formed on the contact member and the interlayer insulating film and electrically connected to the contact member.

Owing to this configuration, the distance between the first contact member and the second contact member can be enlarged, resulting in decreasing the impurity diffused area and improving the reliability of the semiconductor apparatus.

In the third semiconductor apparatus, the active area is plural in number, and in at least two adjacent active areas, at least one of the extension electrodes formed in the plural active areas can be formed so as to stretch over two impurity diffused areas on both sides of the separation.

Owing to this configuration, there is no need to provide a second contact member to each of the impurity diffused areas commonly connected via the extension electrode. Therefore, the size of the semiconductor apparatus can be decreased and the reliability thereof can be improved.

The third semiconductor apparatus can further comprise a gate insulating film formed on the gate electrode, and each of the extension electrodes located on the sides of the gate electrode can be formed so as to cover substantially the entire top surface of the first insulating film, and a gap between the edges of adjacent extension electrodes is buried in the second insulating film.

This configuration ensures the insulation of an unused gate electrode by means of the second insulating film.

In the third semiconductor apparatus, the active area is plural in number, and the semiconductor apparatus can be further provided with a third insulating film formed on each of the extension electrodes; and a local interconnection formed above the first, second and third insulating films and below the interlayer insulating film for connecting the impurity diffused areas, the gate electrode and the like.

At least one part of the local interconnection can cross over the gate electrode.

This configuration can decrease the number of the interconnections in the upper layer because the local interconnection is used for the connection between the components. In addition, there is no need to form a contact hole through the interlayer insulating film reaching the impurity diffused area or the like. Therefore, it is possible to decrease the mask alignment margin of each component, resulting in minimizing the size of the semiconductor apparatus and improving the reliability thereof.

In order to accomplish the third object, a fourth semiconductor apparatus of the invention comprises a semiconductor substrate; a separation formed on part of the semiconductor substrate; a plurality of active areas formed in areas surrounded by the separation on the semiconductor substrate; a conductive member stretching over the active area and the separation in each of the active areas and serving as a gate electrode on the active area; and two impurity diffused areas formed on both sides of the conductive member in each of the active areas. Each impurity diffused area extends from a point in contact with the conductive member in a direction parallel to the conductive member and is bent at an end portion thereof so as not to come in contact with adjacent impurity diffused layer, and the bent end portion serves as a contact to an interconnection in an upper layer. This semiconductor apparatus functions as a master slice.

A semiconductor apparatus functioning as a master slice can be realized as follows:

The semiconductor apparatus comprises a semiconductor substrate; a separation formed on part of the semiconductor substrate; a plurality of active areas formed in areas surrounded by the separation on the semiconductor substrate; a plurality of conductive members formed in each of the active areas so as to stretch over the active area and the separation and extend in a direction parallel to one another, and serving as gate electrodes on the active area; and a plurality of impurity diffused areas formed between the conductive members in each of the active areas and between an end conductive member and the separation. In this semiconductor apparatus, at least two impurity diffused areas of the plural impurity diffused areas extend from points in contact with the conductive members in a direction parallel to the conductive members and are bent at end portions thereof so as not to come in contact with adjacent impurity diffused areas and the bent end portions serve as contacts to interconnections in an upper layer.

The impurity diffused area between the conductive members extends from a point in contact with the conductive member in a direction parallel to the conductive member and is bent at an end portion thereof so as not to come in contact with adjacent impurity diffused area, and the bent end portion serves as a contact to interconnections in an upper layer.

In the semiconductor apparatus functioning as a master slice, owing to the above-mentioned configuration, the contact area for the connection between the impurity diffused area and the interconnection in the upper layer is formed at the end portion of the diffused area making an inroad into the separation. Therefore, it is possible to extremely shorten the length of the interconnection for connecting the diffused areas between the adjacent active areas. Additionally, since the end portion of the impurity diffused area is bent so as not to interfere the adjacent impurity diffused area, the active area and the separation can be minimized.

The semiconductor apparatus can further comprise an interlayer insulating film deposited on the active areas, the conductive members and the separation; a contact hole formed through the interlayer insulating film so as to reach the conductive member located on each active area; a contact member made of a conductive material buried in the contact hole and electrically connected to the conductive member; and an interconnecting member formed on the interlayer insulating film and the contact member and electrically connected to the contact member.

Owing to this configuration, the contact member can be connected to the top surface of the gate electrode located on the active area, and hence, the area of the separation can be further decreased.

Furthermore, the third semiconductor apparatus having the aforementioned configuration can be easily manufactured by the following production method:

The basic production method for the semiconductor apparatus comprises a first step of forming a separation on a semiconductor substrate so as to surround at least one active area; a second step of forming a gate electrode and a gate insulating film on the active area; a third step of forming impurity diffused areas by introducing an impurity into areas on both sides of the gate electrode on the semiconductor substrate: a fourth step of forming a first side wall on each side surface of the gate electrode and the gate insulating film by depositing an insulating film on the substrate after the third step and conducting anisotropic etching on the insulating film; a fifth step of forming an extension electrode including a thin film portion in contact with the first side wall and a thick film portion which is thicker than the thin film portion and is formed with a level difference therebetween, so as to cover the impurity diffused areas, by depositing a conductive film on the substrate after the fourth step and making a pattern of the conductive film; and a sixth step of forming a second side wall stretching over the level difference of the extension electrode and the first side wall by depositing an insulating film on the substrate after the fifth step and conducting anisotropic etching on the insulating film.

The production method can further comprise steps of depositing an interlayer insulating film on the semiconductor substrate after the sixth step; forming a contact hole through the interlayer insulating film so as to reach a top surface of the gate electrode located on the active area; and forming a contact member buried in the contact hole and an interconnecting member to be connected to the contact member by depositing a conductive film within the contact hole and on the interlayer insulating film and making a pattern of the conductive film.

The production method can further comprise steps of depositing an interlayer insulating film on the semiconductor substrate after the sixth step; forming a contact hole through the interlayer insulating film so as to reach a top surface of the extension electrode; and forming a contact member buried in the contact hole and an interconnecting member to be connected to the contact member by depositing a conductive film within the contact hole and on the interlayer insulating film and making a pattern of the conductive film.

In the first step, the separation can be formed so as to partition a plurality of active areas, and in the fifth step, the extension electrode can be formed so as to stretch over adjacent two impurity diffused areas and the separation between the impurity diffused areas in at least two adjacent active areas of the plural active areas.

In the fifth step, the extension electrodes can be formed on the both sides of the gate electrode, so as to cover substantially the entire top surface of the first insulating film, and so that a gap between the extension electrodes can be buried in the second side wall in the sixth step.

The production method can further comprise steps of forming a local interconnection for connecting the gate electrode, the impurity diffused areas and the like after the sixth step; depositing an interlayer insulating film on the semiconductor substrate bearing the local interconnection; forming a contact hole through the interlayer insulating film so as to reach a top surface of the local interconnection; and forming a contact member buried in the contact hole and an interconnecting member to be connected to the contact member by depositing a conductive film within the contact hole and on the local interconnection and making a pattern of the conductive film.

BRIEF DESCRIPTION OF THE DRAWINGS

FIGS. 9a through 9f are sectional views for showing the structural change in the production procedures of a semiconductor apparatus according to a sixth embodiment of the invention:

FIGS. 10a through 10c are sectional views for showing the structural change up to the formation of an extension electrode in the production procedures of a semiconductor apparatus according to a seventh embodiment of the invention:

FIGS. 11a through 11c are sectional views for showing the structural change after the formation of a silicon nitride film serving as a second side wall in the production procedures of the semiconductor apparatus of the seventh embodiment;

FIGS. 12a through 12c are sectional views for showing the structural change up to the formation of a second side wall in the production procedures of a semiconductor apparatus according to an eighth embodiment of the invention;

FIGS. 13a and 13b are sectional views for showing the structural change after the formation of a local interconnection in the production procedures of the semiconductor apparatus of the eighth embodiment;

DETAILED DESCRIPTION OF THE INVENTION (Embodiment 1)

Figure 1:
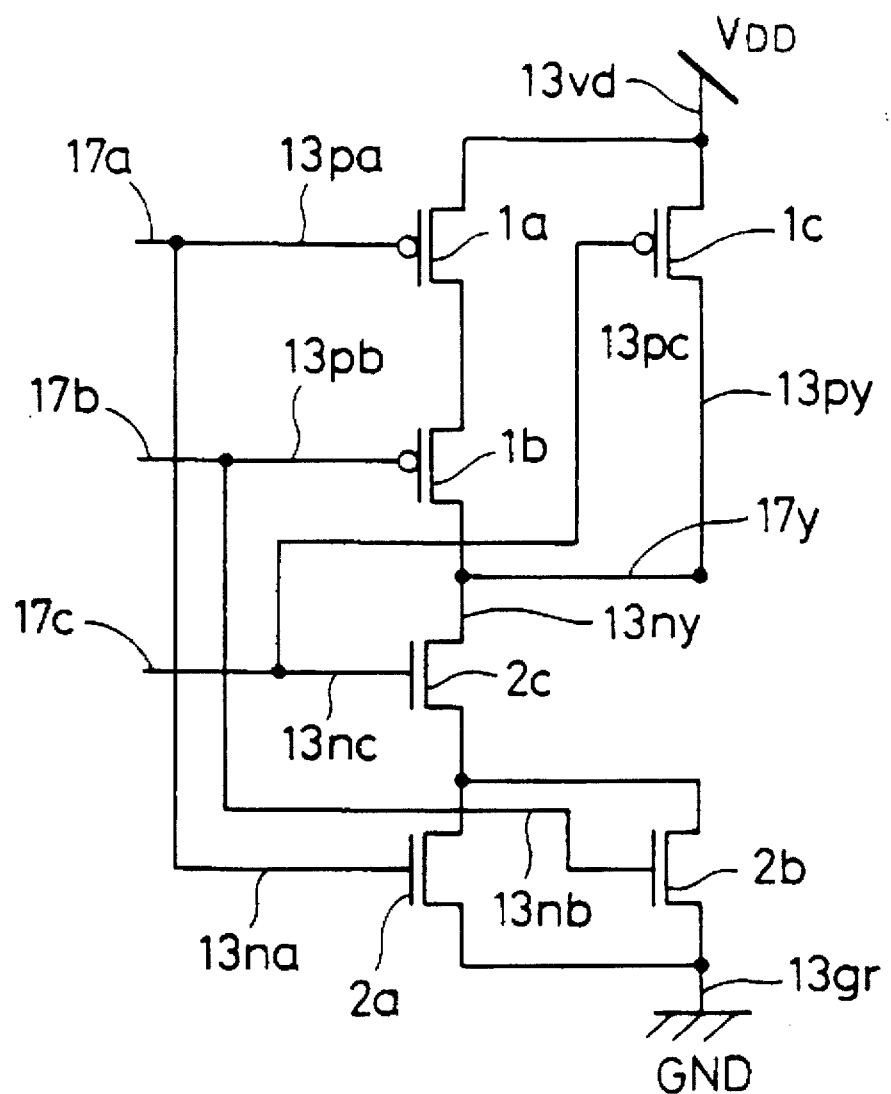
FIG. 1 is an electric circuit diagram of a CMOS logic circuit of a first embodiment of the invention.
Figure 2A:
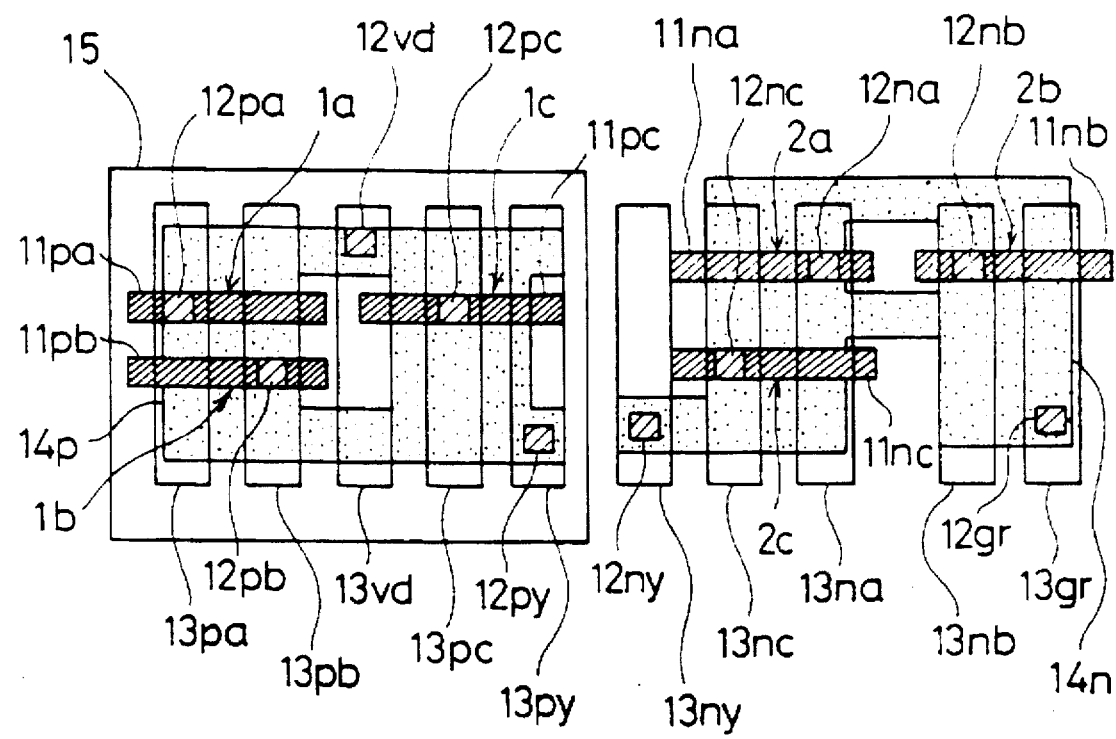
FIGS. 2a and 2b are plane views showing the configuration of a semiconductor apparatus of the first embodiment for realizing the CMOS logic circuit of FIG. 1, after the formation of gates and aluminum interconnections, respectively.
Figure 2B:
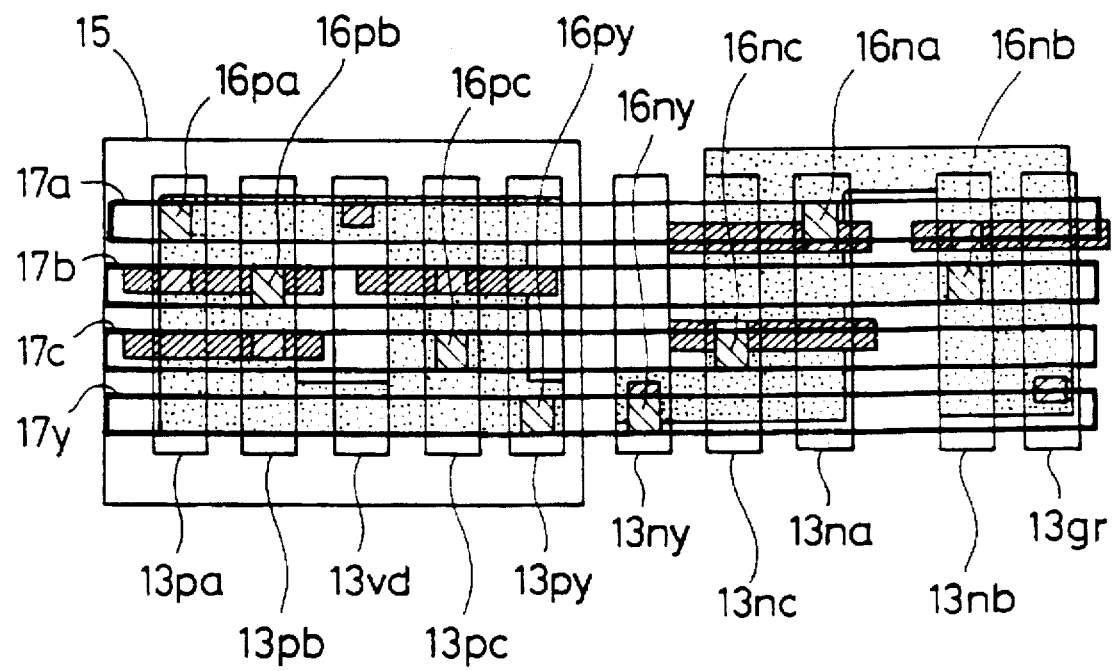

The first embodiment of the invention will now be described. FIG. 1 shows an electric circuit of a cell, that is, a semiconductor apparatus of this embodiment. FIGS. 2a and 2b are schematic plane views for showing the structure of the cell having the circuit configuration of FIG. 1 after the formation of first layer aluminum interconnections and second layer aluminum interconnections, respectively.

FIG. 1 shows an exemplified configuration of a CMOS logic circuit including three P-channel transistors 1a through 1c and three N-channel transistors 2a through 2c.

When a logic circuit as shown in FIG. 1 is to be formed, as is shown in FIG. 2a, an N well 15 is formed on a P-type semiconductor substrate, and a separation is formed out of a LOCOS film so as to surround an active area to be used for a P-channel transistor within the N well 15 and to surround another active area to be used for an N-channel transistor on the P-type semiconductor substrate where the N well 15 is not formed. It is noted that there exists the semiconductor substrate around the pattern shown in FIG. 2a but the substrate is omitted for the sake of simplification. Then, the respective active areas are provided with gate wires 11pa through 11pc and 11na through 11nc each made of a polysilicon film aligned in the same direction (in the horizontal direction in FIG. 2a). By using the gate wires 11pa through 11pc and 11na through 11ncas masks, impurity is injected into the active areas, so as form a P-type diffused layer 14p and an N-type diffused layer 14n. After this, five first layer aluminum interconnections 13pa, 13pb, 13pc, 13vd and 13py are formed above the gate wires 11pa through 11pc with a first interlayer insulating film (nor shown) sandwiched therebetween, so as to be perpendicular to the gate wires. Similarly, five first layer aluminum interconnections 13na, 13nb, 13nc, 13ny and 13gr are formed above the gate wires 11na through 11nc with the first interlayer insulating film sandwiched therebetween, so as to be perpendicular to the gate wires. Simultaneously with the formation of these first layer aluminum interconnections, CW contacts 12pa, 12pb, 12pc, 12vd and 12py are formed out of the same aluminum material as that for the aluminum interconnections for connecting the first layer aluminum interconnections 13pa through 13py to a portion of each of the gate wires 11pa through 11pc on the active area and to two portions of the P-type diffused layer 14p. Similarly, CW contacts 12na, 12nb, 12nc, 12ny and 12gr are formed for connecting the first layer aluminum interconnections 13nathrough 13gr to a portion of each of the gate wires 11pathrough 11pc on the active area and to two portions of the N-type diffused layer 14n. In portions where the contacts are formed, contact holes through the first interlayer insulating film are previously formed. These CW contacts 12 can be formed by depositing the same aluminum material as that for the first layer aluminum interconnections in the contact holes, or by burying a metal with a high melting point such as tungsten in the contact holes.

Then, as is shown in FIG. 2b, four second layer aluminum interconnections 17a, 17b, 17c and 17y are formed above the first layer aluminum interconnections 13pa through 13gr with a second interlayer insulating film (not shown) sandwiched therebetween, so as to be perpendicular to these first layer aluminum interconnections. Simultaneously with the formation of the second layer aluminum interconnections, CX contacts 16pa, 16pb, 16pc, 16py, 16nc, 16na and 16nb are formed out of the same aluminum material as that for the second layer aluminum interconnections, for connecting the second layer aluminum interconnections 17a through 17y to the first layer aluminum interconnections 13pa, 13pb, 13pc, 13py, 13ny, 13nc, 13na and 13nb.

Thus, the gates and the sources/drains of the transistors 1a, 1b, 2a and 2b of FIG. 1 are interconnected to one another through the aluminum interconnections shown in FIGS. 2a and 2b. As is shown in FIG. 1, the source of the transistor 1c is connected to the drain of the transistor 2c through the two first layer aluminum interconnections 13py and 13ny and the second layer aluminum interconnection 17y. The drains of the transistors 1a and 1c are connected to a power supply for supplying a supply voltage VDD via the first layer aluminum interconnection 13vd, and the sources of the transistors 2a and 2b are grounded via the first layer aluminum interconnection 13gr.

As another interconnection method, it is possible to provide the interconnection via the first layer aluminum interconnections by using an outside area of the cell. The selection of the interconnection methods is made depending upon the connecting method between cells and the number of usable interconnection layers.

Figure 16A:
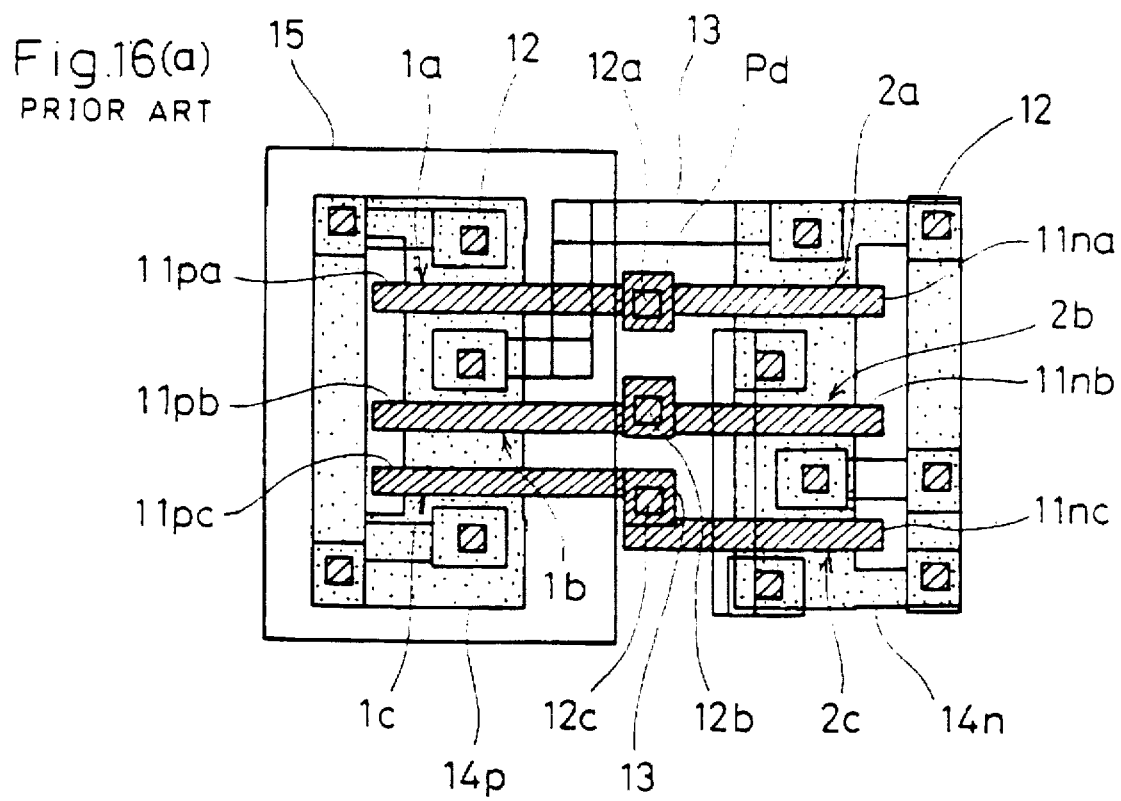
FIGS. 16a and 16b are plane views for showing the configuration of the conventional semiconductor apparatus for realizing the CMOS logic circuit of FIG. 1, after the formation of gates and aluminum interconnections.
Figure 16B:
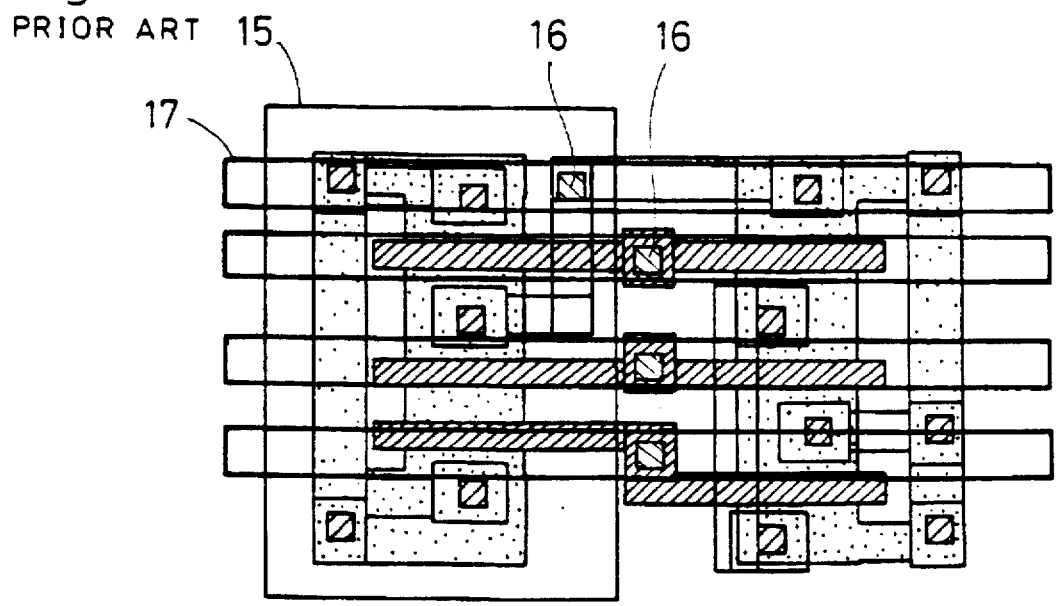

In the configuration of FIG. 2b, the CW contacts 12 for connecting the first layer aluminum interconnections 13 and the gate wires 11 are in contact with the gate wires 11 at portions thereof located on the active area. At the contact portions of the gate wires 11, no pad Pd is formed which provides a mask alignment margin for forming a contact in the conventional configuration (see FIGS. 16a and 16b). Therefore, owing to the configuration of this embodiment, the active area of the cell can be very efficiently utilized, and as a result, the width of a separation can be minimized. In addition, since each side of the cell can be provided with a connection terminal, connections between the cells can be efficiently formed.

Figure 17:
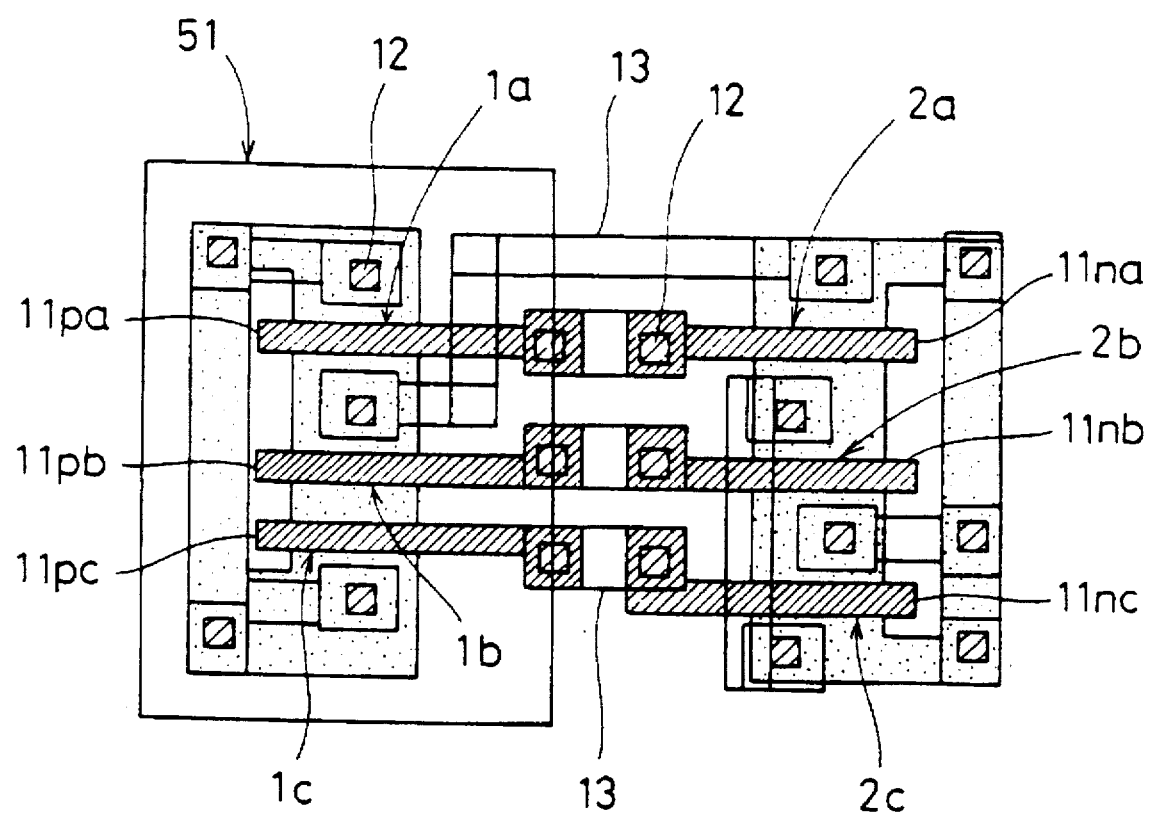
FIG. 17 is a plane view of a conventional semiconductor apparatus having a dual gate structure.
Figure 18:
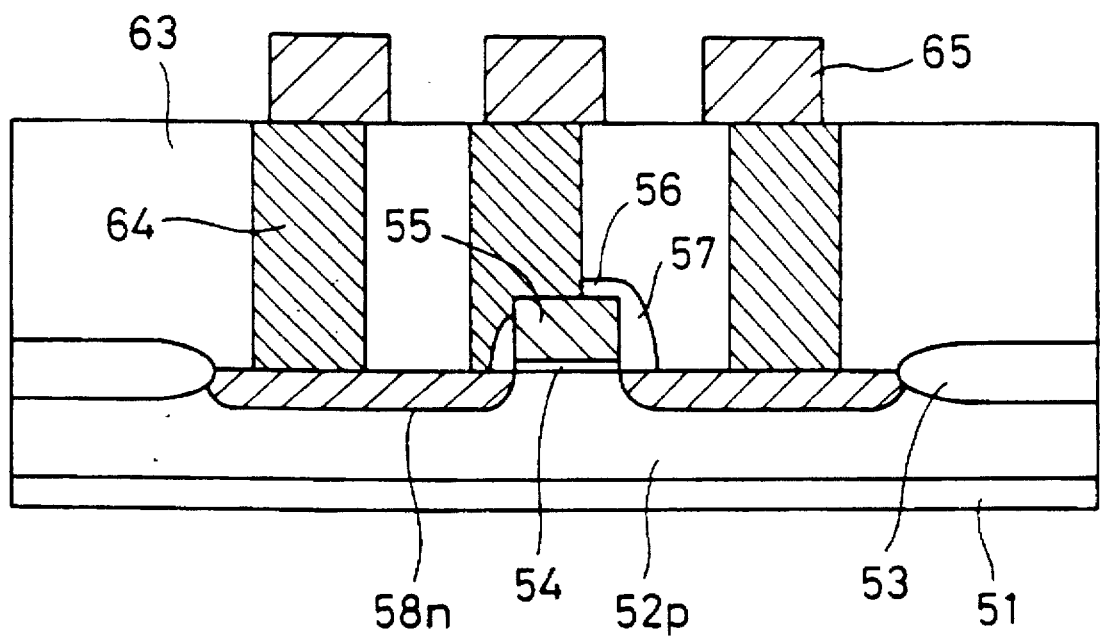
FIG. 18 is a vertical sectional view showing a basic structure of a conventional semiconductor apparatus.

Even in the case where a dual gate structure is adopted, refinement can be easily done because a connection pattern can be formed in any area excluding the areas for the transistors under almost uniform conditions. Specifically, there is no need to provide a contact for connecting the gates of different types in an area excluding the active areas for the transistors as is done in the conventional configuration shown in FIG. 17. Therefore, an interconnection interval can be smaller than in the conventional layout configuration by approximately 10%. As a result, the area of the cell can be further minimized.

Now, a test for examining the effect of the decrease of the occupied area according to this embodiment will be described. The area of the circuit according to this embodiment (see FIG. 2b) was compared with the area of the circuit having the conventional configuration (see FIG. 16b) using the same designing rule. The area according to this embodiment shown in FIG. 2b was 5,400 units (i.e., 135×40 pitches), while that of the conventional configuration shown in FIG. 16b was 6,825 units (i.e., 105×40 pitches). The area of the conventional configuration adopting a dual gate structure shown in FIG. 17 was 7,800 units (i.e., 120×40 pitches). Thus, it was found that the configuration of this embodiment can decrease the occupied area by approximately 20 to 30% as compared with the conventional configuration.

Furthermore, in the configuration shown in FIG. 1, the gate wires, the first layer aluminum interconnections and the second layer aluminum interconnections are regularly formed on substantially the entire substrate. This results in improvement of a patterning accuracy in photolithography as compared with that in a conventional irregular layout configuration. Therefore, a margin can be minimized, and the occupied area can be further decreased.

(Embodiment 2)

Figure 3A:
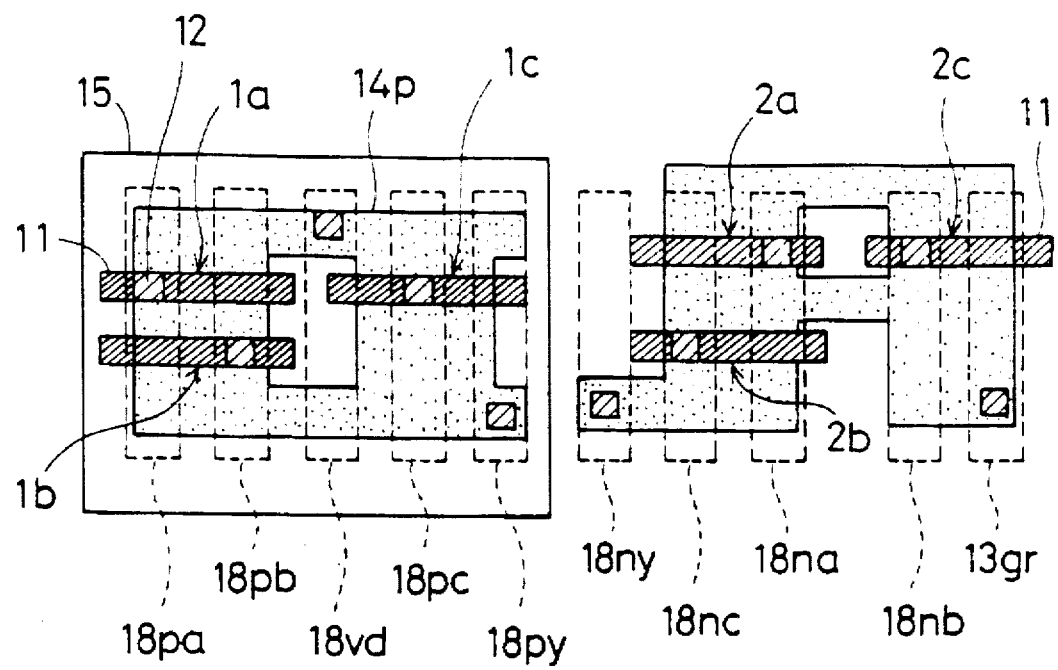
FIGS. 3a and 3b are plane views for showing the configuration of a semiconductor apparatus of a second embodiment of the invention, after the formation of interconnections perpendicular to rates by using local interconnections and the formation of aluminum interconnections, respectively.
Figure 3B:
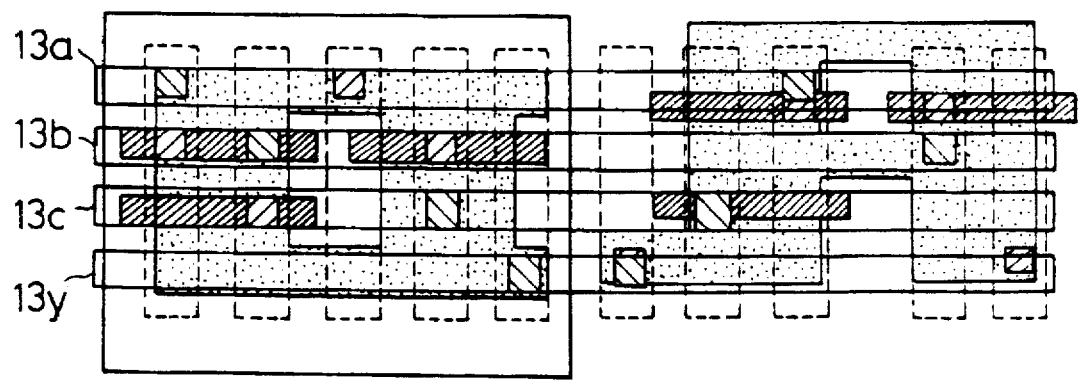

The second embodiment of the invention will now be described referring to FIGS. 3a and 3b. FIGS. 3a and 3b are schematic plane views for showing the configuration of a semiconductor apparatus, in which the first layer aluminum interconnections adopted in Embodiment 1 shown in FIGS. 2a and 2b are replaced with local interconnections 18pa, 18pb, 18vd, 18pc, 18py, 18ny, 18nc, 18na, 18nb and 18gr as wires perpendicular to the gates, and the second layer aluminum interconnections shown in FIGS. 2a and 2b are replaced with first layer aluminum interconnections 13a, 13b, 13c and 13y. No interlayer insulating film is formed below the local interconnections 18. A CW contact 12 is formed at a portion where an insulating film on the gate wire 11 has an opening so as to allow the local interconnection 18 to be in contact with the gate wire 11. In FIGS. 3a and 3b, the reference numerals used to refer to the elements shown in FIG. 1 are partly omitted.

As is shown in FIGS. 3a and 3b, the respective elements of the transistors are connected not through an interlayer insulating film but by using the local interconnections in this embodiment. Therefore, the number of the interconnection layers can be decreased as compared with the configuration of Embodiment 1, while achieving the same function. In addition, since there is no need to form a contact hole through the interlayer insulating film in the impurity diffused area, the impurity diffused area can be decreased, resulting in further minimization of the size of the semiconductor apparatus.

(Embodiment 3)

Figure 4A:
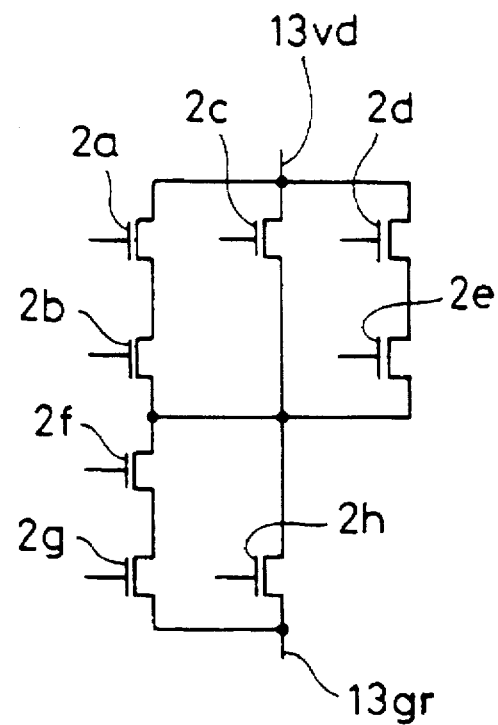
FIGS. 4a and 4b are an electrical circuit diagram of a path transistor circuit of a third embodiment of the invention and a plane view of a semiconductor apparatus for realizing the electrical circuit, respectively.
Figure 4B:
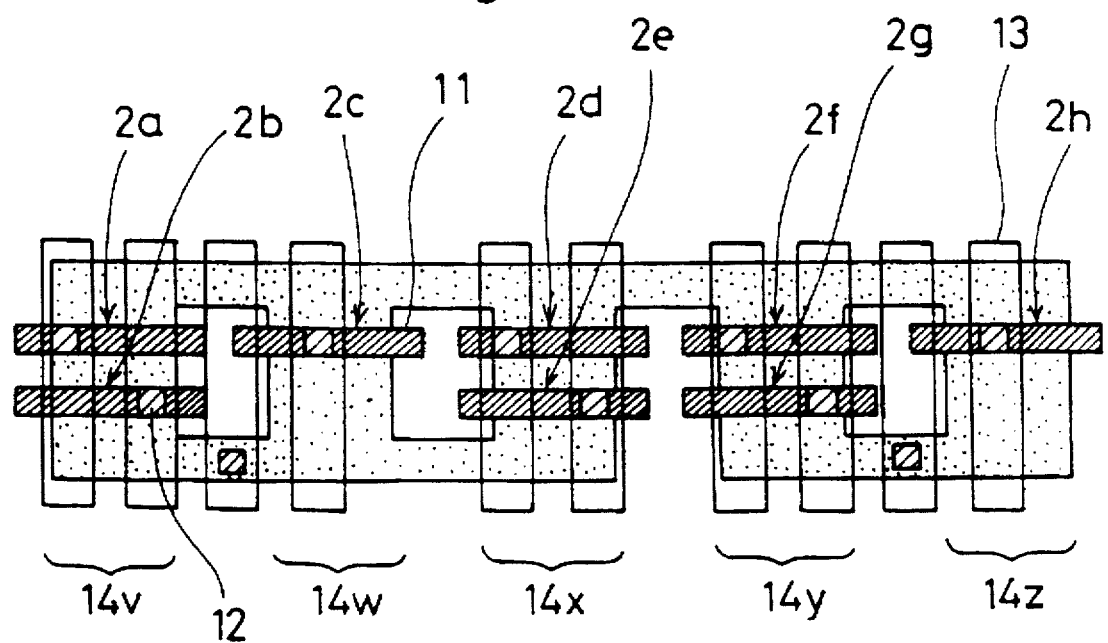

The third embodiment of the invention will now be described referring to FIGS. 4a and 4b. FIG. 4a is an electrical circuit diagram of path transistors contained in a semiconductor apparatus of this embodiment, and FIG. 4b is a plane view of the semiconductor apparatus for realizing the electrical circuit of FIG. 4a. FIG. 4b shows the configuration after the formation of first layer aluminum interconnections, and the configuration after the formation of second layer aluminum interconnections is herein omitted.

In this embodiment, the respective path transistors are all N-channel transistors 2a through 2h. As is shown in FIG. 4a, a path transistor is a circuit for obtaining a logic value on the basis of whether or not predetermined two points are conducting, and is formed out of a combination of a series connection and a parallel connection. The layout of the path transistors is shown in FIG. 4b, wherein diffused islands 14v through 14z are formed so as to correspond to respective series paths and the diffused islands 14v through 14z are connected at their sources and drains by using impurity diffused areas. Such a path transistor can be used as part of a static or dynamic logic circuit or part of a path logic circuit. As a result, the semiconductor apparatus can attain a smaller size as in Embodiment 1.

(Embodiment 4)

The fourth embodiment will now be described referring to FIGS. 5a, 5b, 6a and 6b.

Figure 5A:
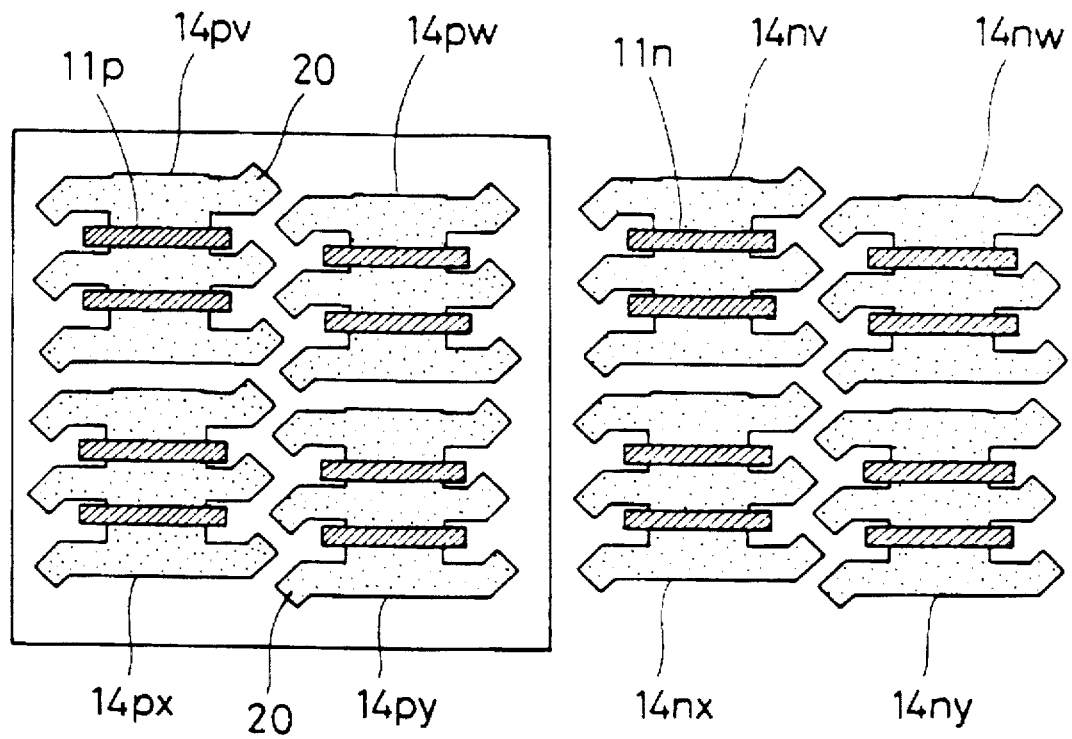
FIGS. 5a and 5b are plane views respectively showing a master slice of a gate array and an exemplified interconnection pattern formed on the master slice according to a fourth embodiment of the invention.
Figure 5B:
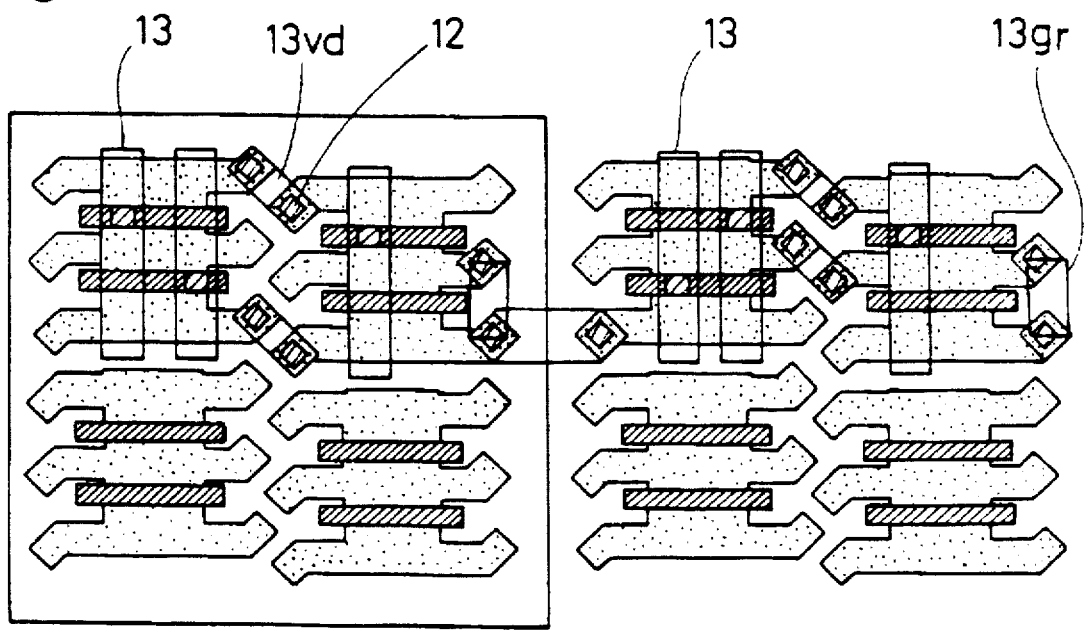

FIGS. 5a and 5b are plane views for showing a master slice of a gate array of this embodiment and showing an exemplified pattern of aluminum interconnections on the master slice, respectively. As is shown in FIG. 5a, the master slice of this embodiment includes two types of polysilicon gates 11n and 11p and a plurality of diffused islands 14pvthrough 14py and 14nv through 14ny. On the diffused islands 14pv through 14py and 14nv through 14ny are formed gates of transistors. The diffused islands 14pv through 14py and 14nvthrough 14ny are also provided with extension portions extending along the gates from impurity diffused areas on the side of the gates. Each of the extension portions is provided with a contact forming area 20 where a contact is formed for connecting the impurity diffused areas of the adjacent diffused islands. Although the basic layout configuration alone is described in this embodiment, it is also possible to dispose an area for forming a contact for stabilizing a substrate potential depending upon the characteristic of a used process. FIG. 5b shows an exemplified configuration for realizing the CMOS logic circuit of FIG. 1 on the master slice of FIG. 5a. It is possible to obtain a semiconductor circuit with a desired function by forming CW contacts 12 and first layer aluminum interconnections 18 on necessary portions. For example, on the contact forming areas 20 between the diffused islands 14pv and 14pw are formed an aluminum interconnection 13vd to be connected to a power supply and an aluminum interconnection 13gr to be grounded, and these aluminum interconnections can be connected to each other by using the CW contacts 12 with ease.

Figure 6A:
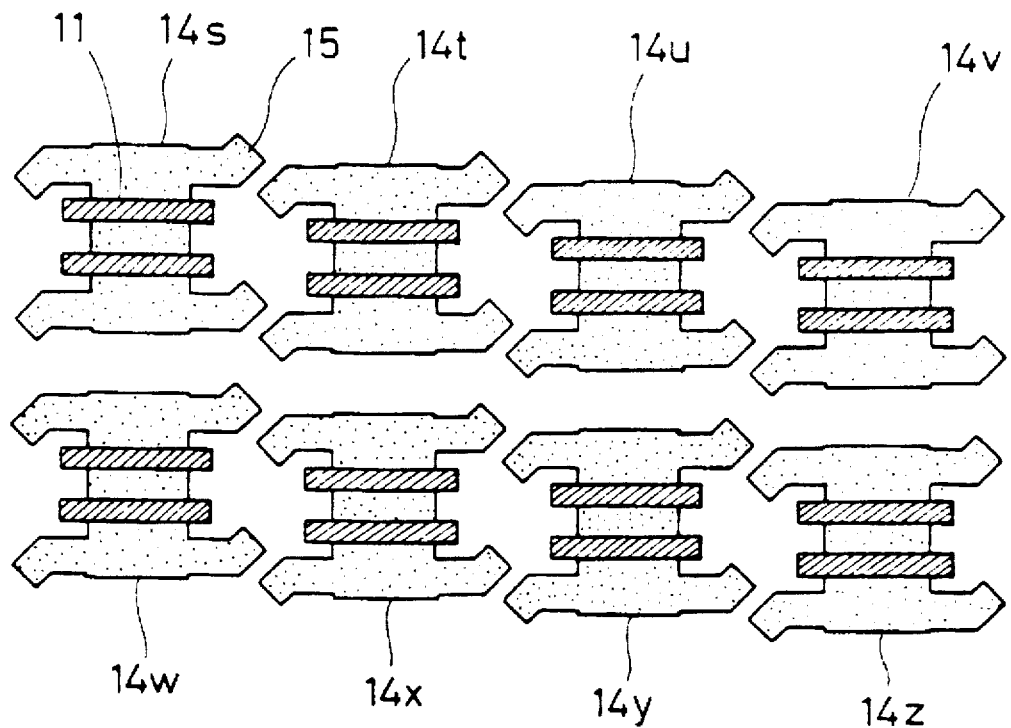
FIGS. 6a and 6b are plane views respectively showing a master slice of a gate array and an exemplified interconnection pattern formed on the master slice in another configuration of the fourth embodiment of the invention.
Figure 6B:
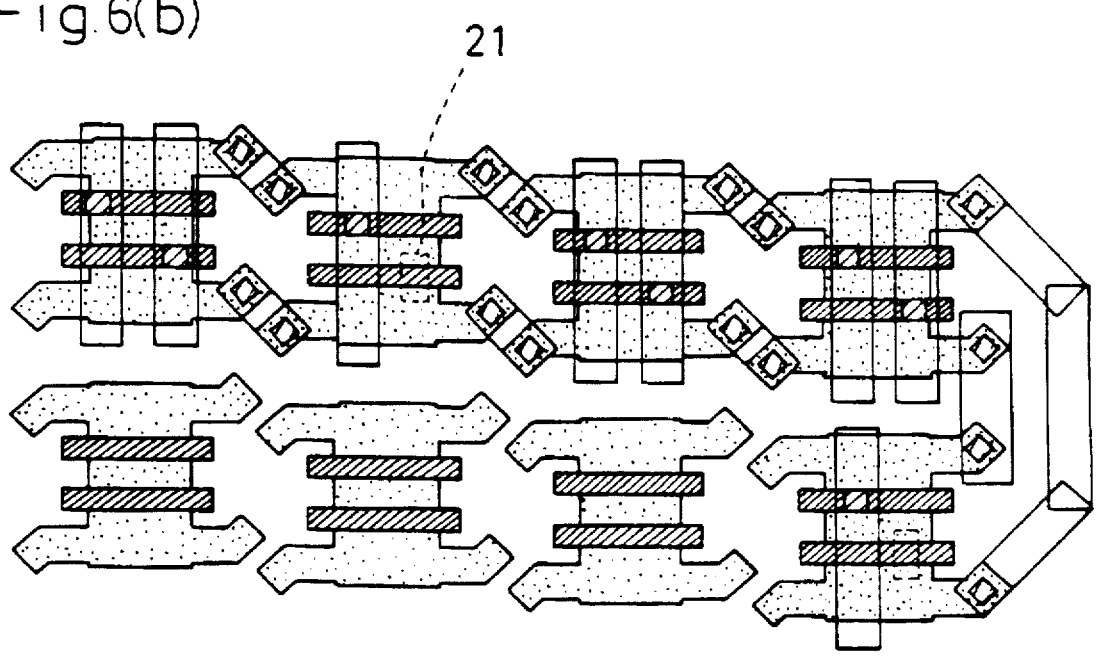

FIGS. 6a and 6b are plane views for showing a master slice of a gate array having a different configuration from that shown in FIGS. 5a and 5b and for showing the pattern of the first layer aluminum interconnections 18 on this master slice, respectively. As is shown in FIGS. 6a and 6b, all the transistors are of N-type, and the impurity diffused area between the gates is provided with no extension portion, so that the transistors can be efficiently connected in series. The configuration for connecting the respective diffused islands is the same as that shown in FIGS. 5a and 5b. As is shown in FIG. 6b, a local interconnection 21 is provided so as to cross a gate not serving as a transistor, and thus, it is possible to cause a short-circuit between the impurity diffused areas on the both sides of the gate.

(Embodiment 5)

Figure 7:
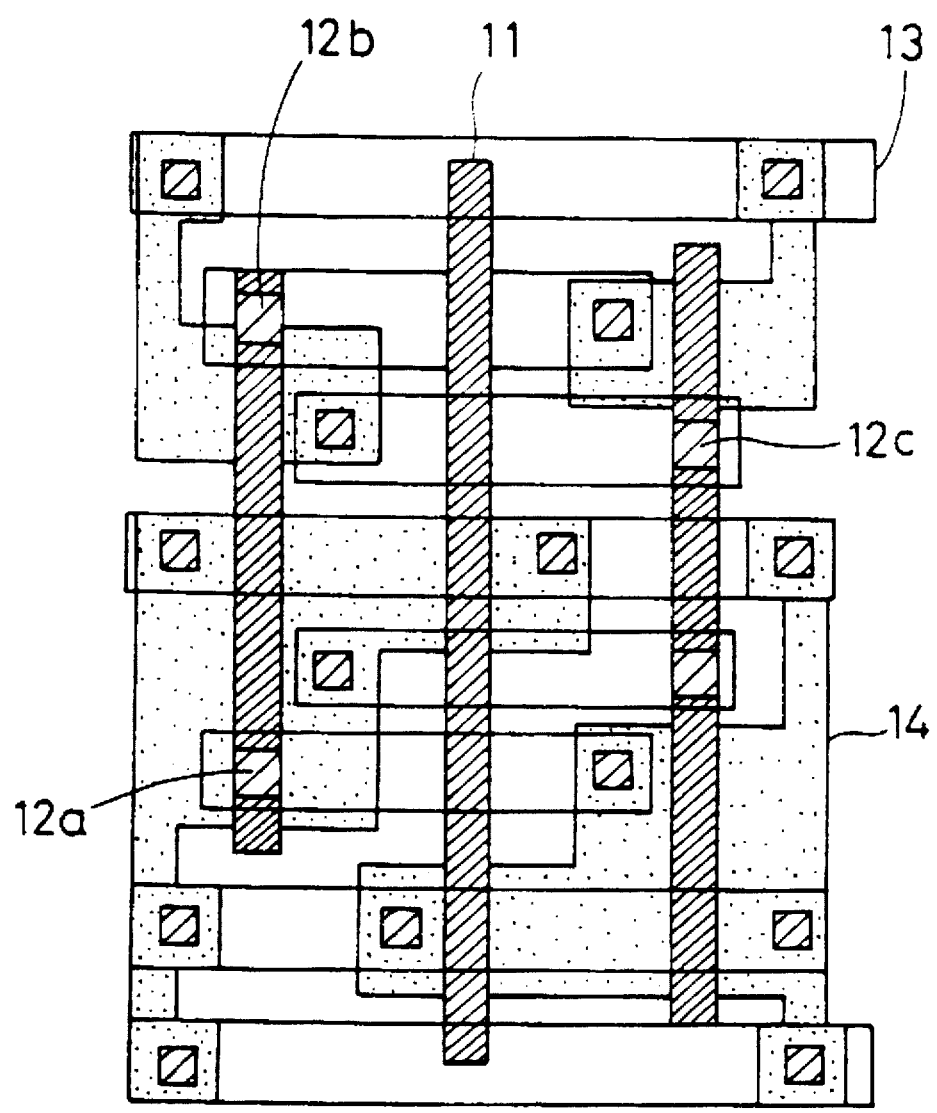
FIG. 7 is a plane view of a semiconductor apparatus for realizing an SRAM circuit according to a fifth embodiment of the invention.
Figure 8:
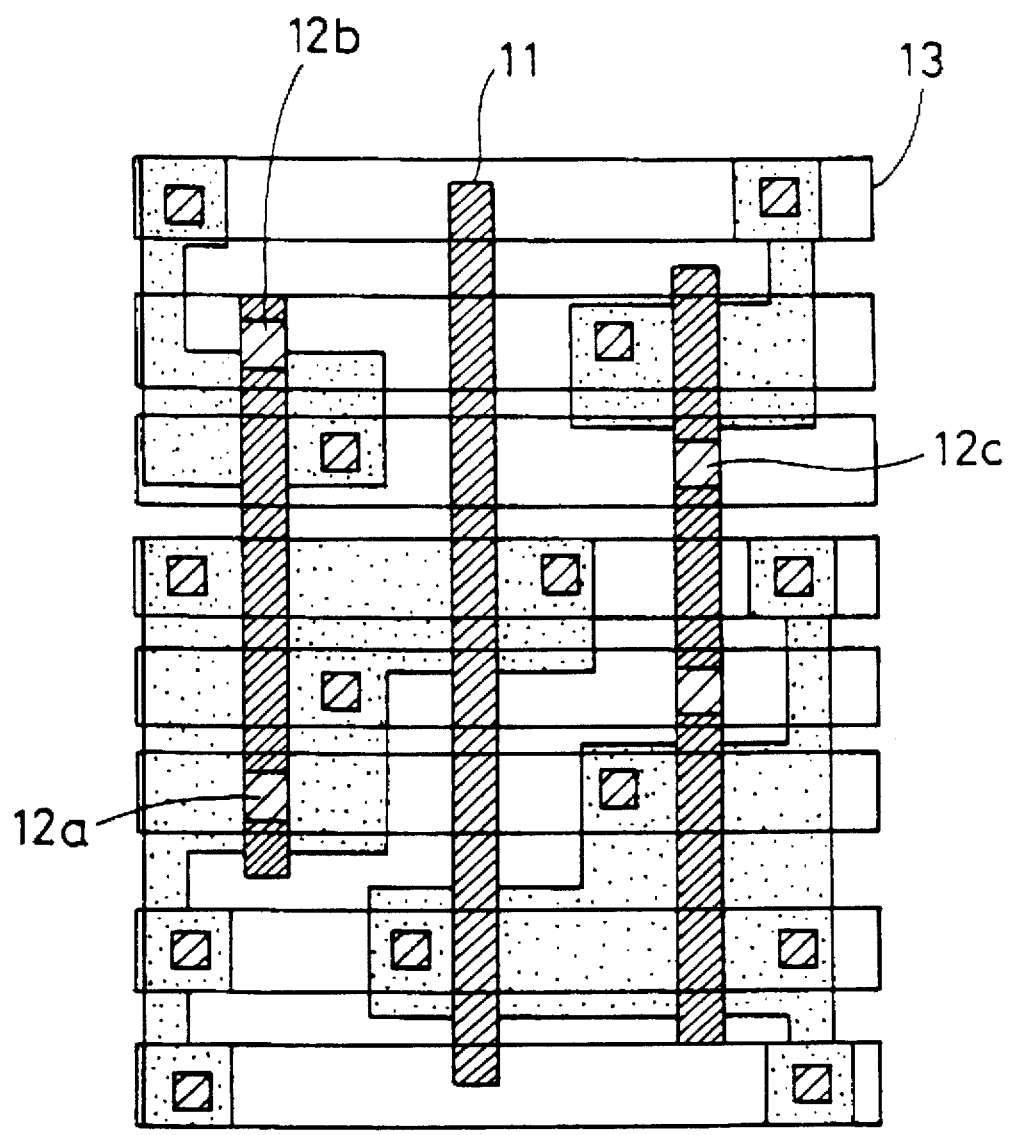
FIG. 8 is a plane view of a semiconductor apparatus for realizing the SRAM circuit according to the fifth embodiment in which the gate width is regulated.

The fifth embodiment will now be described referring to FIGS. 7 and 8. FIGS. 7 and 8 are plane views of an SRAM circuit in which a gate 11 on an impurity diffused area 14 is in contact with a CW contact 12a extended from an aluminum interconnection 13 in an upper layer. As other contacts, the SRAM circuit includes a CW contact 12b in contact with a portion extending between the impurity diffused area 14 of the gate 11 and a separation, and a CW contact 12c in contact with a portion of the gate 11 located completely on the separation. In any of the contacts, the gate 11 has no mask alignment margin for the contact members 12, namely, the gate 11 has no pad area.

Figure 15:
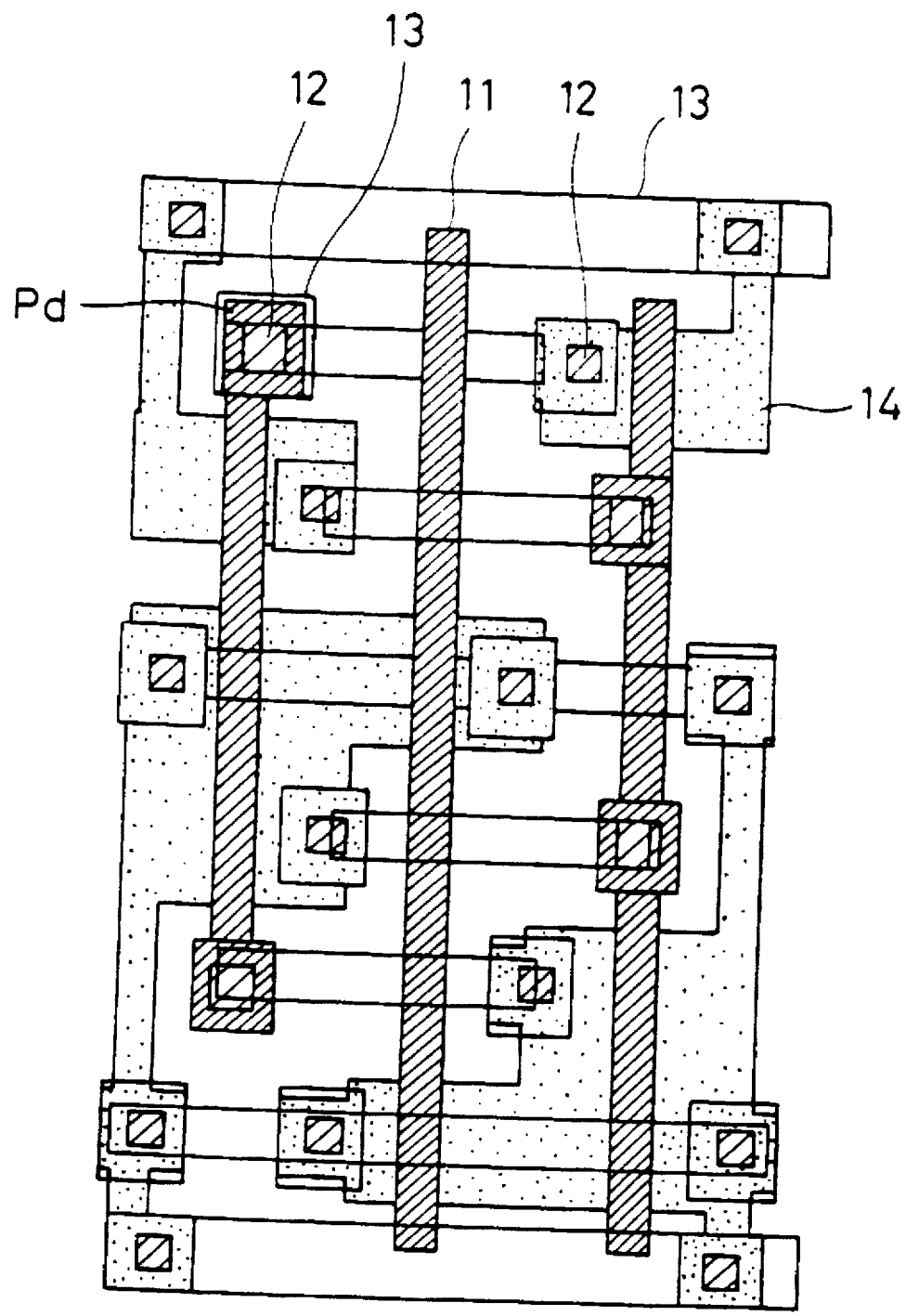
FIG. 15 is a plane view of a conventional semiconductor apparatus for realizing an SRAM circuit.

Even when the CW contact 12 is in contact with the portion of the gate located on the separation in this manner, the area occupied by the circuit can be decreased by eliminating the mask alignment margin. In the SRAM circuit shown in FIG. 7, the occupied area can be reduced by approximately 20% as compared with that of the conventional SRAM circuit of FIG. 15. As is easily understood from FIG. 7, the area occupied by the semiconductor circuit can be further reduced by making the width of the gate wire 11 not exceed the width of the contact member 12.

Also, in the circuit pattern shown in FIG. 8, the occupied area can be further reduced by approximately 10% as compared with that of the semiconductor circuit having the pattern shown in FIG. 7 by making constant the lengths of the respective first layer aluminum interconnections 13. This is because an etching failure is not likely to be caused in a resist in the photolithography when the interconnections in a regular pattern are etched, and therefore, the margin between the aluminum interconnections can be minimized.

(Embodiment 6)

The sixth embodiment will now be described referring to FIGS. 9a through 9f. FIGS. 9a through 9f are vertical sectional views for showing the structural change in the production procedures of an N-channel MOS transistor having a contact on a gate electrode.

First, as is shown in FIG. 9a, after forming a P-type diffused layer 52p on a P-type silicon substrate 51, a separation 58 is formed thereon out of a LOGOS film with a thickness of approximately 500 nm. Further, after a gate oxide film 54 having a thickness of approximately 7 nm is formed in an active area surrounded by the separation 53 on the semiconductor substrate, a polysilicon film with a thickness of approximately 250 nm is deposited thereon by low pressure CVD, and a diffusing process is conducted by using, for example, $POCl_3$, thereby introducing phosphorus, that is, an N-type impurity, into the polysilicon film. Furthermore, an HTO film having a thickness of, for example, 150 nm is deposited thereon. The HTO film is used as a protection film not to expose the top surface of the polysilicon film constructing a gate electrode in the subsequent etch back process of the oxide film for forming a side wall. Then, after forming a desired resist mask (not shown), the polysilicon film and the HTO film are etched by a known dry etching technique, so as to make a pattern of a gate electrode 55 and a gate insulating film 56. Next, after forming a silicon oxide film having a thickness of for example, 100 nm, the oxide film is etched by the etch back method, thereby forming a first side wall 57. At this point, since the gate electrode 55 is protected by the gate insulating film 56, the surface of the polysilicon film constructing the gate electrode 55 is not exposed by the over-etching of approximately 20% of the normal etching. Then, after forming a desired resist mask (not shown), arsenic ions, that is, an N-type impurity, are injected into the P-type diffused layer 52p by ion injection (at acceleration energy of 40 keV and a dose of $5 \times 10^{15}$ $cm^{-2}$) by using the resist mask and the gate electrode as masks, thereby forming an N-type high concentration diffused layer 58n. Specifically, the gate electrode 55, the gate oxide film 54 and the N-type high concentration diffused layer 58n working as the source/drain together form an N-channel MOS transistor.

Next, as is shown in FIG. 9b, a tungsten film 59a having a thickness of 300 nm is deposited by, for example, CVD so as to come in direct contact with the N-type high concentration diffused layer 58n. At this point, the maximum thickness of the tungsten film 59a located on the N-type high concentration diffused layer 58n is approximately 500 nm, which is larger than the thickness of the tungsten film 59a located on the gate electrode, because the gate electrode makes a level difference. Furthermore, a silicon oxide film 60a having a thickness of 200 nm is formed thereon.

Next, as is shown in FIG. 9c, by using a resist mask 61 having openings corresponding to the gate electrode 55 and predetermined areas on the sides of the gate electrode 55, the silicon oxide film 60a and the tungsten film 59a are etched, thereby forming a pattern of an extension electrode 59 extended from the source/drain and an electrode insulating film 60. At this point, the extension electrode 59 located on the N-type high concentration diffused layer 58n has a step portion including a thin film portion 59x adjacent to the first side wall 57, a side wall portion 59y opposing the first side wall 57 with the thin film portion 59x therebetween and a thick film portion 58z extending from the upper end of the side wall portion 58y toward the separation 58. In this embodiment, the extension electrode 59 located on the separation 58 also has a step portion including a thin film portion 59w at the end thereof.

The etching amount is required to be controlled in order to make the height of the extension electrode 59 at its end close to the gate electrode higher than that of the first side wall 57 and not to expose the top surface of the N-type high concentration diffused layer 58n in this manner. For example, when the etching amount for the tungsten film 59a is approximately 400 nm, the thin film portion 59x of the extension electrode 59 can attain a thickness of approximately 100 nm, while the portion covering the gate electrode 55 of the tungsten film 59a constructing the extension electrode 59 can be removed. Furthermore, the width of the opening of the resist mask 61 is designed to be preferably larger than the length of the gate electrode 55 by 0.4 μm. When the opening is smaller than this size, a second side wall 62 formed later can be completely buried on the gate and no contact can be formed on the gate. When the opening of the resist mask 61 is too large, a portion of the extension electrode 59 close to the first side wall 57 is exposed through the formation of the second side wall 62. Therefore, when alignment shift is caused in the photolithography during the formation of a contact on the gate electrode 55, the gate electrode 55 and the N-type high concentration diffused layer 58n can be electrically short-circuited through the contact.

Next, as is shown in FIG. 9d, a silicon nitride film 62a with a thickness of, for example, 150 nm is deposited on the entire surface of the resultant substrate. Then, as is shown in FIG. 9e, the second side wall 62 is formed by the etch back method so as to cover the side wall portion 59y and the thin film portion 59x of the extension electrode 59 and at least part of the first side wall 57. At this point, the thick film portion 59z of the extension electrode 59 is positioned higher than the top surface of the gate electrode 55 by approximately 200 nm. Furthermore, by appropriately setting the width of the thin film portion 59x of the extension electrode 59, the second side wall can be formed so as to cover the top surface of the thin film portion 59x of the extension electrode 59 and expose the top surface of the gate insulating film 55. Then, tungsten, that is, the extension element 59, remaining on the separation 58 and the like is removed.

Next, as is shown in FIG. 9f, after an interlayer insulating film 88 is deposited and flattened on the entire surface of the resultant substrate, a contact hole and a berried electrode 64, i.e., a contact member, are formed. At this point, even when the alignment shift is caused in the photolithography, the second side wall 62 works as an etching stopper. Therefore, the bottom of the contact hole does not reach the extension electrode 59, resulting in an electrically stable contact being formed on the gate. Then, a metal interconnection 65 is formed, and thus, the N-channel MOS transistor having the contact on the gate is produced.

Although tungsten is used to form the extension electrode 59 extended from the source/drain in this embodiment, the invention is not limited to the material. For example, the extension electrode can be made of a polysilicon film dosed with an impurity or any other conductive film.

In addition, although the first side wall 57 and the second side wall 62 of this embodiment are made of a silicon oxide film and a silicon nitride film, respectively, the side walls can be formed out of the same conductive material. However, the material for the second side wall 62 preferably has higher etching selectivity than the material for the first side wall 57. This is because the second side wall 82 works as an etching stopper in the formation of a contact to the gate electrode 55.

(Embodiment 7)

The seventh embodiment will now be described referring to FIGS. 10a through 10c and 11a through 11c. FIGS. 10a through 10c and 11a through 11c are vertical sectional views showing the structural change in the production procedures of a CMOS transistor in which a contact is formed on a gate electrode and a diffused layer of an N-channel NOS transistor and that of a P-channel NOS transistor are connected to each other.

First, as is shown in FIG. 10a, after a P-type diffused layer 52p and an N-type diffused layer 52n are formed on a P-type silicon substrate 51, a separation 58 is formed thereon out of a LOCOS film having a thickness of approximately 500 nm. Then, as is shown in FIGS. 10a through 10c and 11a through 11c, the similar procedures to those described in Embodiment 6 and shown in FIGS. 9a through 9f are conducted on the diffused layers 52p and 52n.

Through the production method for the semiconductor apparatus of this embodiment, a CMOS transistor having a contact on a gate electrode is eventually produced as is shown in FIG. 11c. In this CMOS transistor, an N-type high concentration diffused layer 58n of the N-channel NOS transistor formed on the P-type diffused layer 52p is connected to a P-type high concentration diffused layer 58p of the P-channel MOS transistor formed on the N-type diffused layer 52n via a common extension electrode 59. By forming the extension electrode 59 in this pattern, high concentration diffused layers of different conductivity types, which are conventionally connected by a multi-layer interconnection, can be connected at a level of a local interconnection in a lower layer. As a result, a production cost can be reduced. In addition, since connection to the high concentration diffused layer can be accomplished by self-alignment contact, there is no need to form a contact hole through an interlayer insulating film reaching the high concentration diffused layer. Accordingly, the mask alignment margin for each element can be reduced, and the area of the high concentration diffused layer can be decreased.

In the procedure shown in FIG. 11a, in the extension electrode 59 located on the separation 53, the thickness of the extension electrode 59 is thicker on a boundary portion between the separation 53 and the active area and is thinner in the remaining portions. By forming a level difference of the extension electrode 59 in this manner, the remaining portion of the extension electrode 59 located on the separation 53 can be removed together with the silicon nitride film 62a without using a mask during the formation of the second side wall 62 as is shown in FIG. 11b.

(Embodiment 8)

The eighth embodiment will now be described referring to FIGS. 12a through 12c, 13a and 13b. FIGS. 12a through 12c, 13a and 13b are vertical sectional views for showing the structural change in the production procedures for a transistor in which a contact is formed on a gate electrode and a plurality of metal interconnection layers can be connected on an active area of the transistor via a local interconnection.

First, as is shown in FIGS. 12a and 12b, the similar procedures to those described in Embodiment 8 and shown in FIG. 9a through 9c are conducted. However, a resist mask 61 is used so that an extension electrode 59 is formed similarly to Embodiment 6 in a portion where a contact is to be formed on a gate electrode 55, and so that a step portion of the extension electrode is formed on the gate electrode 55 on the both sides of a high concentration diffused layer (see an area Rst) or on a separation in a portion where a contact is to be formed on the high concentration diffused layer. In addition, in a portion where a connection between a local interconnection formed later and the gate electrode 55 in a lower layer is to be avoided, the width of the opening of the resist mask 61 is 0.3 μm or less (see an area Rde), so that a gap on this portion formed by removing a tungsten film 59a can be completely buried in a second side wall formed later.

Next, as is shown in FIG. 12c, a silicon nitride film having a thickness of, for example, approximately 150 nm is formed and is subsequently etched back, thereby forming the second side wall 62. Then, similarly to the procedure shown in FIG. 11b of Embodiment 7, the extension electrode 59 (i.e., the tungsten film 59a) remaining on the separation 58 and the like is removed. At this point, in the area Rde, the gate electrode 55 is completely buried in the second side wall 62. Furthermore, in the area Rst, The tungsten film remaining on an N-type high concentration diffused layer 58n through the formation of the extension electrode 59 is completely removed, and the second side wall 62 is formed on the both side surfaces of the extension electrode 59 so as to electrically insulating the N-type high concentration diffused layer 58n and the extension electrode 59 even when a conductive film is formed therebetween.

Next, as is shown in FIG. 13a, a tungsten film serving as a local interconnection 86 is deposited on the entire surface of the resultant substrate, and then the tungsten film is made into a pattern by using a resist mask 67, thereby forming the local interconnection 66. Specifically, The local interconnection 18 shown in FIG. 8a can be attained by using the local interconnection 66.

Then, as is shown in FIG. 13b, an interlayer insulating film 68 is formed and flattened, and a contact hole and a buried electrode 64 are formed. At this point, even when alignment shift is caused in the photolithography, the second side wall 62 serves as an etching stopper, thereby preventing the bottom of the contact hole from reaching the extension electrode 59. As a result, an electrically stable contact can be formed on the gate electrode 55. Furthermore, a metal interconnection 65 in an upper layer (corresponding to the first layer aluminum interconnections 13 shown in FIG. 3b) can be freely connected to the gate electrode 55 and the N-type high concentration diffused layer 58n via the local interconnection 66 (corresponding to the local interconnection 18 shown in FIG. 3a) within the area where the transistor is formed. Accordingly, the freedom in the design can be improved, and the occupied area of the semiconductor circuit can be reduced.

(Embodiment 9)

Figure 14A:
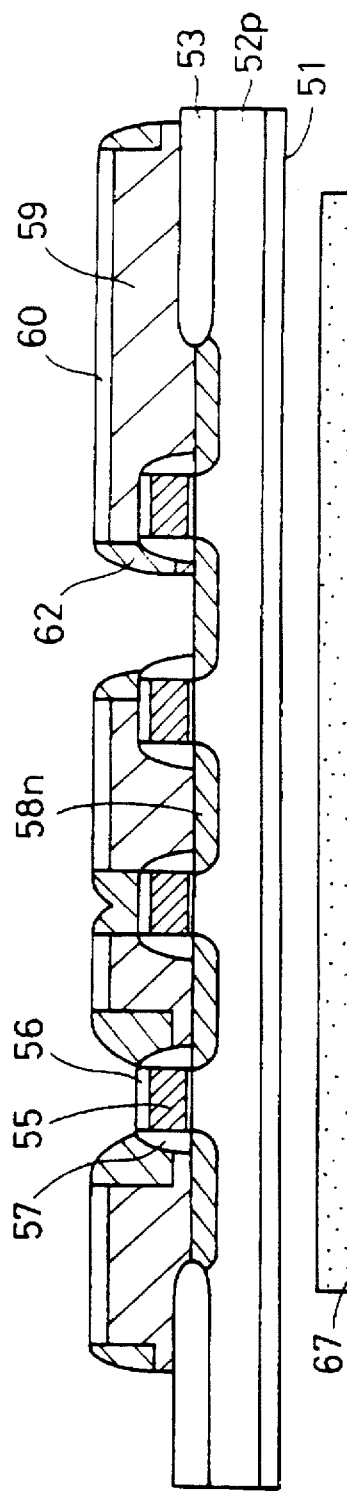
FIGS. 14a through 14c are sectional views for showing the structural change in the production procedures of a semiconductor apparatus according to a ninth embodiment of the invention.
Figure 14B:
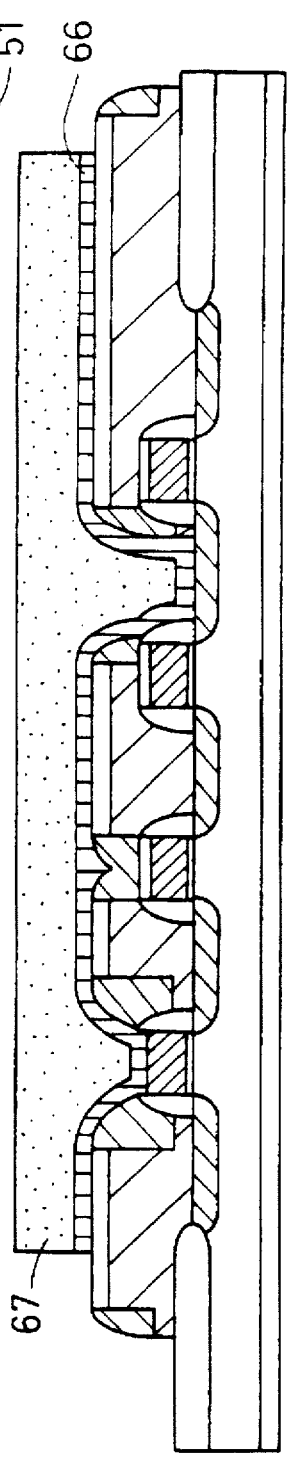
Figure 14C:
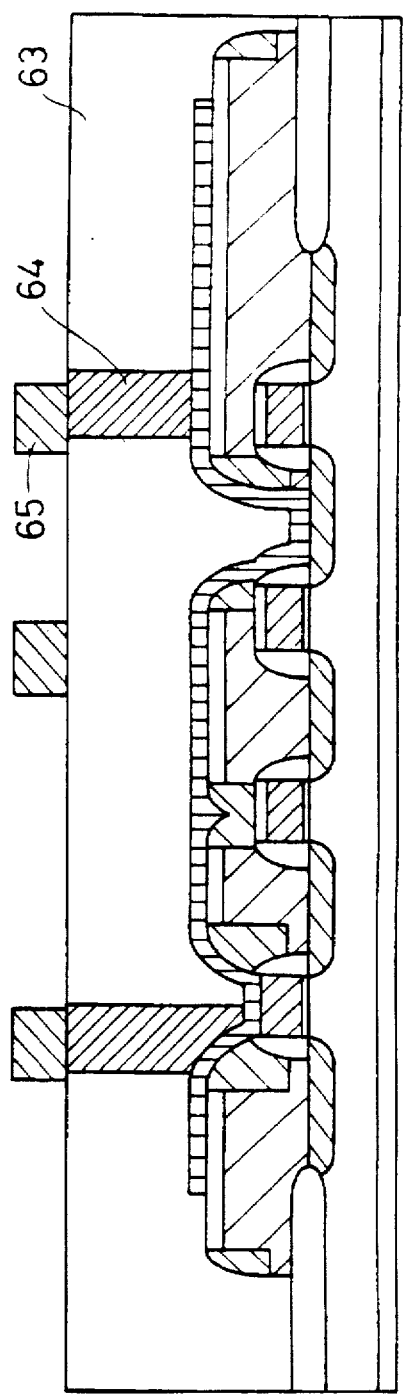

The ninth embodiment will now be described referring to FIGS. 14a through 14c. FIGS. 14a through 14c are vertical sectional views showing the structural change in the production procedures for a transistor in which a contact is formed on a gate electrode and a plurality of gate electrodes can be connected to a high concentration diffused layer on an active area via a local interconnection.

First, as is shown in FIG. 14a, the similar procedures to those shown in FIGS. 12a through 12c of Embodiment 8 are conducted, so as to attain the configuration shown in FIG. 12c.

Then, as is shown in FIG. 14b, on a gate electrode 55 which is to be in contact with a local interconnection formed later, an exposed gate insulating film 56 is removed, and then a tungsten film serving as a local interconnection 66 is deposited on the entire surface of the resultant substrate. By using a resist mask 67, the tungsten film is made into a pattern, thereby forming the local interconnection 66.

Next, as is shown in FIG. 14c, an interlayer insulating film 63 is formed and flattened, a contact hole is formed, and a buried electrode 64 and a metal interconnection 65 are formed.

According to this embodiment, an optional gate electrode 55 can be connected to a high concentration diffused layer 58n on the active area via the local interconnection 66.

What is claimed is:

1. A production method for a semiconductor apparatus comprising:

a first step of forming a separation on a semiconductor substrate so as to surround at least one active area;

a second step of forming a gate electrode and a gate insulating film on the active area;

a third step of forming impurity diffused areas by introducing an impurity into areas on both sides of the gate electrode on the semiconductor substrate;

a fourth step of forming a first side wall on each side surface of the gate electrode and the gate insulating film by depositing a first insulating film on the substrate after the third step and conducting anisotropic etching on the first insulating film;

a fifth step of forming extension electrodes including a thin film portion in contact with the first side wall and a thick film portion which is thicker than the thin film portion and is formed with a level difference therebetween, so as to cover the impurity diffused areas, by depositing a first conductive film on the substrate after the fourth step and making a pattern of the first conductive film; and a sixth step of forming a second side wall stretching over the level difference of the extension electrodes and the first side wall by depositing a second insulating film on the substrate after the fifth step and conducting anisotropic etching on the second insulating film.

2. The production method for a semiconductor apparatus of claim 1, further comprising steps of:

depositing an interlayer insulating film on the semiconductor substrate after the sixth step;

forming a contact hole through the interlayer insulating film so as to reach a top surface of the gate electrode located on the active area: and forming a contact member buried in the contact hole and an interconnecting member to be connected to the contact member by depositing a second conductive film within the contact hole and on the interlayer insulating film and making a pattern of the second conductive film.

3. The production method for a semiconductor apparatus of claim 1, further comprising steps of:

depositing an interlayer insulating film on the semiconductor substrate after the sixth step;

forming a contact hole through the interlayer insulating film so as to reach a top surface of the extension electrodes; and forming a contact member buried in the contact hole and an interconnecting member to be connected to the contact member by depositing a second conductive film within the contact hole and on the interlayer insulating film and making a pattern of the second conductive film.

4. The production method for a semiconductor apparatus of claim 1, wherein the separation is formed so as to partition a plurality of active areas in the first step, and in the fifth step, the extension electrode is formed so as to stretch over adjacent two impurity diffused areas and the separation between the impurity diffused areas in at least two adjacent active areas of the plurality of active areas.

5. The production method for a semiconductor apparatus of claim 1, wherein in the fifth step, the extension electrodes are formed on the both sides of the gate electrode, so as to cover substantially the entire top surface of the first insulating film, and so that a gap between the extension electrodes can be buried in the second side wall in the sixth step.

6. The production method for a semiconductor apparatus of claim 1, further comprising steps of:

forming a local interconnection for connecting the gate electrode and the impurity diffused areas after the sixth step;

depositing an interlayer insulating film on the semiconductor substrate bearing the local interconnection;

forming a contact hole through the interlayer insulating film so as to reach a top surface of the local interconnection; and forming a contact member buried in the contact hole and an interconnecting member to be connected to the contact member by depositing a second conductive film within the contact hole and on the local interconnection and making a pattern of the second conductive film.

* * * * *